United States Patent
Inoue et al.

(10) Patent No.: US 9,900,011 B2
(45) Date of Patent: Feb. 20, 2018

(54) SEMICONDUCTOR APPARATUS, ROUTING MODULE, AND CONTROL METHOD OF SEMICONDUCTOR APPARATUS

(71) Applicant: Kabushiki Kaisha Toshiba, Minato-ku, Tokyo (JP)

(72) Inventors: Kazuki Inoue, Yokohama Kanagawa (JP); Kohei Oikawa, Kawasaki Kanagawa (JP); Yukimasa Miyamoto, Yokohama Kanagawa (JP); Kosuke Hatsuda, Bunkyo Tokyo (JP); Shuou Nomura, Yokohama Kanagawa (JP); Kojiro Suzuki, Kawasaki Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 15/255,583

(22) Filed: Sep. 2, 2016

(65) Prior Publication Data
US 2017/0257099 A1    Sep. 7, 2017

Related U.S. Application Data

(60) Provisional application No. 62/304,440, filed on Mar. 7, 2016.

(51) Int. Cl.
*H03K 19/173* (2006.01)
*H03K 19/177* (2006.01)

(52) U.S. Cl.
CPC ..... *H03K 19/1735* (2013.01); *H03K 19/1776* (2013.01); *H03K 19/17728* (2013.01)

(58) Field of Classification Search
CPC ......... H03K 19/1735; H03K 19/17728; H03K 19/1776
(Continued)

(56) References Cited

U.S. PATENT DOCUMENTS

| 5,271,014 A | 12/1993 | Bruck et al. |
| 5,479,055 A | 12/1995 | Eccles |

(Continued)

FOREIGN PATENT DOCUMENTS

| JP | 36-028330 A | 2/1994 |
| JP | 06-224744 A | 8/1994 |
| JP | 10-143465 A | 5/1998 |

OTHER PUBLICATIONS

Anthony Yu et al., "Defect-Tolerant FPGA Switch Block and Connection Block With Fine-Grain Redundancy for Yield Enhancement," Proc.of FPL Aug. 2005, pp. 255-262.

*Primary Examiner* — Dylan White
(74) *Attorney, Agent, or Firm* — White & Case LLP

(57) ABSTRACT

According to one embodiment, a semiconductor apparatus includes a block and a controller. The block includes a logic circuit and a routing module. The routing module includes a plurality of first wiring lines, a plurality of second wiring lines, switches, and a wiring line switching circuit. The switches are arranged to perform connection and disconnection between the first wiring lines and the second wiring lines. The wiring line switching circuit is arranged to switch a wiring line for transmitting the signal, among the first wiring lines and the second wiring lines. The controller is arranged to control driving of the switches and the wiring line switching circuit.

20 Claims, 22 Drawing Sheets

(58) Field of Classification Search
USPC .............................................. 326/37–41, 47
See application file for complete search history.

(56) References Cited

U.S. PATENT DOCUMENTS

| | | | |
|---|---|---|---|
| 5,777,887 A | | 7/1998 | Marple et al. |
| 6,034,536 A | | 3/2000 | McClintock et al. |
| 6,131,169 A | | 10/2000 | Okazawa et al. |
| 7,902,862 B2* | | 3/2011 | How .................... G06F 13/4022 326/38 |
| 8,856,718 B1* | | 10/2014 | Zhao .................... G06F 17/5077 716/121 |
| 2007/0152708 A1* | | 7/2007 | Madurawe ....... H03K 19/17796 326/39 |
| 2009/0072858 A1* | | 3/2009 | D'Souza .............. H03K 19/177 326/47 |
| 2010/0007378 A1* | | 1/2010 | Marrakchi ....... H03K 19/17736 326/39 |
| 2012/0262009 A1* | | 10/2012 | Becker ................ G01R 31/2844 307/113 |
| 2015/0170025 A1* | | 6/2015 | Wu ...................... G06N 3/0635 706/25 |

\* cited by examiner

FIG.8

| X | | | | | | | |
|---|---|---|---|---|---|---|---|
| 0 | 1 | 2 | 3 | 4 | 5 | 6 | 7 |
| 00 | 00 | 00 | 00 | 00 | 00 | 00 | 00 |

FIG.9

| | | X | | | | | | | |
|---|---|---|---|---|---|---|---|---|---|
| | | 0 | 1 | 2 | 3 | 4 | 5 | 6 | 7 |
| | 0 | 1 | 0 | 0 | 0 | 0 | 0 | 0 | 0 |
| | 1 | 0 | 1 | 0 | 0 | 0 | 0 | 0 | 0 |
| | 2 | 0 | 0 | 1 | 0 | 0 | 0 | 0 | 0 |
| Y | 3 | 0 | 0 | 0 | 1 | 0 | 0 | 0 | 0 |
| | 4 | 0 | 0 | 0 | 0 | 1 | 0 | 0 | 0 |
| | 5 | 0 | 0 | 0 | 0 | 0 | 1 | 0 | 0 |
| | 6 | 0 | 0 | 0 | 0 | 0 | 0 | 1 | 0 |
| | 7 | 0 | 0 | 0 | 0 | 0 | 0 | 0 | 1 |

FIG.11

| | X | | | | | | |
|---|---|---|---|---|---|---|---|
| 0 | 1 | 2 | 3 | 4 | 5 | 6 | 7 |
| 00 | 00 | 01 | 10 | 00 | 00 | 00 | 00 |

FIG.12

| | | X | | | | | | | |
|---|---|---|---|---|---|---|---|---|---|
| | | 0 | 1 | 2 | 3 | 4 | 5 | 6 | 7 |
| | 0 | 1 | 0 | 0 | 0 | 0 | 0 | 0 | 0 |
| | 1 | 0 | 1 | 0 | 0 | 0 | 0 | 0 | 0 |
| | 2 | 0 | 0 | 1 | 1 | 0 | 0 | 0 | 0 |
| Y | 3 | 0 | 0 | 1 | 0 | 0 | 0 | 0 | 0 |
| | 4 | 0 | 0 | 0 | 0 | 1 | 0 | 0 | 0 |
| | 5 | 0 | 0 | 0 | 0 | 0 | 1 | 0 | 0 |
| | 6 | 0 | 0 | 0 | 0 | 0 | 0 | 1 | 0 |
| | 7 | 0 | 0 | 0 | 0 | 0 | 0 | 0 | 1 |

○ SWITCH OFF
● SWITCH ON

○ SWITCH OFF
● SWITCH ON

SEMICONDUCTOR APPARATUS, ROUTING MODULE, AND CONTROL METHOD OF SEMICONDUCTOR APPARATUS

CROSS-REFERENCE TO RELATED APPLICATIONS

This application is based upon and claims the benefit of priority from U.S. Provisional Application No. 62/304,440, filed on Mar. 7, 2016; the entire contents of which are incorporated herein by reference.

FIELD

Embodiments described herein relate generally to a semiconductor apparatus, a routing module, and a control method of a semiconductor apparatus.

BACKGROUND

A programmable logic device is a semiconductor apparatus whose logic constitution can be programmed. In relation to programmable logic devices, there is known a technique capable of compensating for a portion where an operational defect has occurred. Programmable logic devices that can perform the compensation are desired to reduce the circuit scale and improve the processing performance.

BRIEF DESCRIPTION OF THE DRAWINGS

FIGS. 8 and 9 are views respectively showing examples of configuration bits in a case where the routing module operates normally;

FIGS. 11 and 12 are views respectively showing examples of configuration bits in a case where a fault has occurred in a switch;

DETAILED DESCRIPTION

In general, according to one embodiment, a semiconductor apparatus includes a block and a controller. The block includes a logic circuit and a routing module. The routing module is arranged to build a transmission route for outputting an input signal from a first element to a second element. The first element and the second element are ones of elements connected to the block and the logic circuit. The routing module includes a plurality of first wiring lines, a plurality of second wiring lines, switches, and a wiring line switching circuit. The plurality of first wiring lines respectively have input ends. The signal is to be input from the first element into one of the input ends. The plurality of second wiring lines respectively have output ends. The signal is to be output from one of the output ends to the second element. The switches are arranged to perform connection and disconnection between the first wiring lines and the second wiring lines. The wiring line switching circuit is arranged to switch a wiring line for transmitting the signal, among the first wiring lines and the second wiring lines. The controller is arranged to control driving of the switches and the wiring line switching circuit.

Exemplary embodiments of a semiconductor apparatus, a routing module, and a control method of a semiconductor apparatus will be explained below in detail with reference to the accompanying drawings. The present invention is not limited to the following embodiments.

First Embodiment

Figure 1:
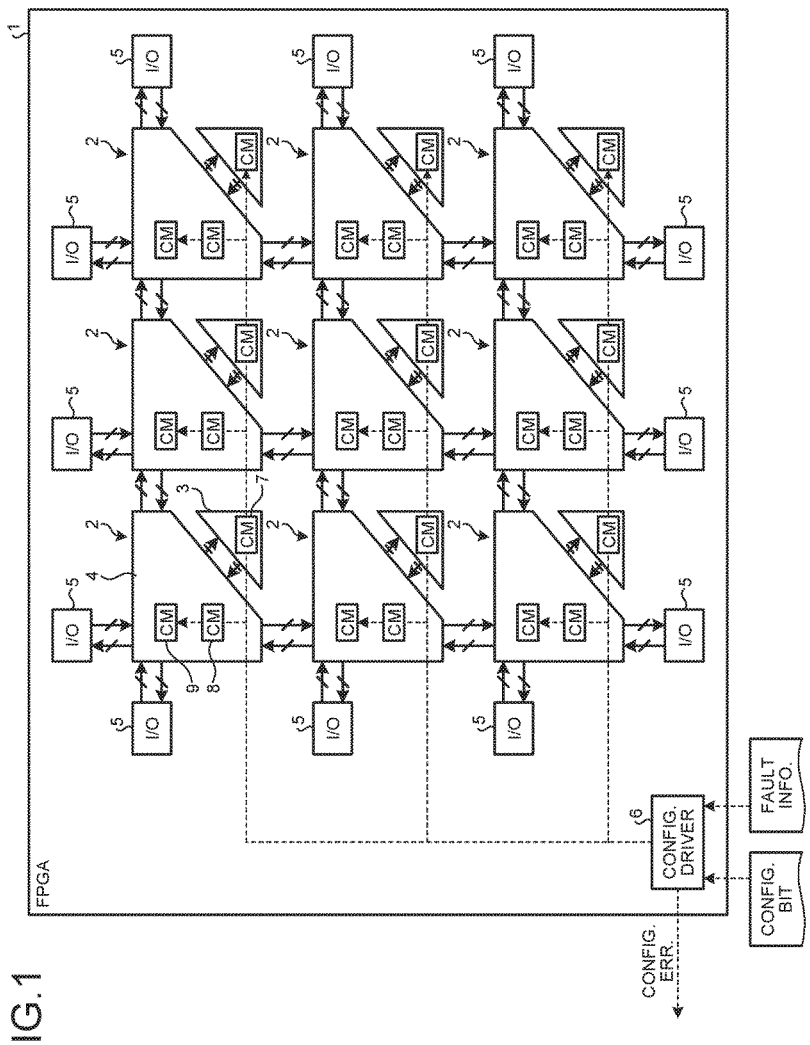
FIG. 1 is a block diagram showing a field programmable gate array (FPGA), which is a semiconductor apparatus according to a first embodiment.

FIG. 1 is a block diagram showing a field programmable gate array (FPGA), which is a semiconductor apparatus according to a first embodiment. The FPGA 1 is a programmable logic device whose hardware logic constitution can be programmed to achieve a desired logic function.

The FPGA 1 includes logic blocks 2, input/output elements (I/O) 5, and a configuration driver (config. driver) 6. In the FPGA 1, a large number of logic blocks 2 are arrayed in a matrix format. The logic blocks 2 are elements each serving as a unit of the logic constitution set in the FPGA 1.

Each of the logic blocks 2 includes a fundamental logic circuit. Adjacent ones of the logic blocks 2 are connected to one another via signal lines. The FPGA 1 is capable of obtaining a logic constitution that can perform a desired process, by arbitrarily setting the connection relations between the logic blocks 2 and the calculating operation contents inside the logic blocks 2.

The I/Os 5 are respectively connected to some logic blocks 2 of the logic blocks 2 via signal lines. The I/Os 5 receive signals from the outside of the FPGA 1 and send the received signals to the logic block 2. Further, the I/Os 5 output signals from the logic blocks 2 to the outside of the FPGA 1. The number of the logic blocks 2 and the number of the I/Os 5 included in the FPGA 1 are not limited to the numbers shown in FIG. 1 but are arbitrary.

Each of the logic blocks 2 includes a processing module 3 and a routing module 4 connected to each other via signal lines.

The processing module 3 is a logic circuit for performing an arithmetic operation and a logic operation. The processing module 3 includes a configuration memory (CM) 7, a LUT (look up table), a gate logic, an adder, a register, and so forth.

The CM 7 holds the correlation between an input pattern treated as an operation object and an output pattern treated as an operation result. The processing module 3 can change its calculating operation function by rewriting the data in the CM 7. FIG. 1 omits illustration of elements other than the CM 7 inside the processing module 3.

The routing module 4 includes wiring lines that can switch signal transmission routes. The routing module 4 includes configuration memories (CM) 8 and 9, a crossbar area, and a wiring line switching circuit.

Figure 2:
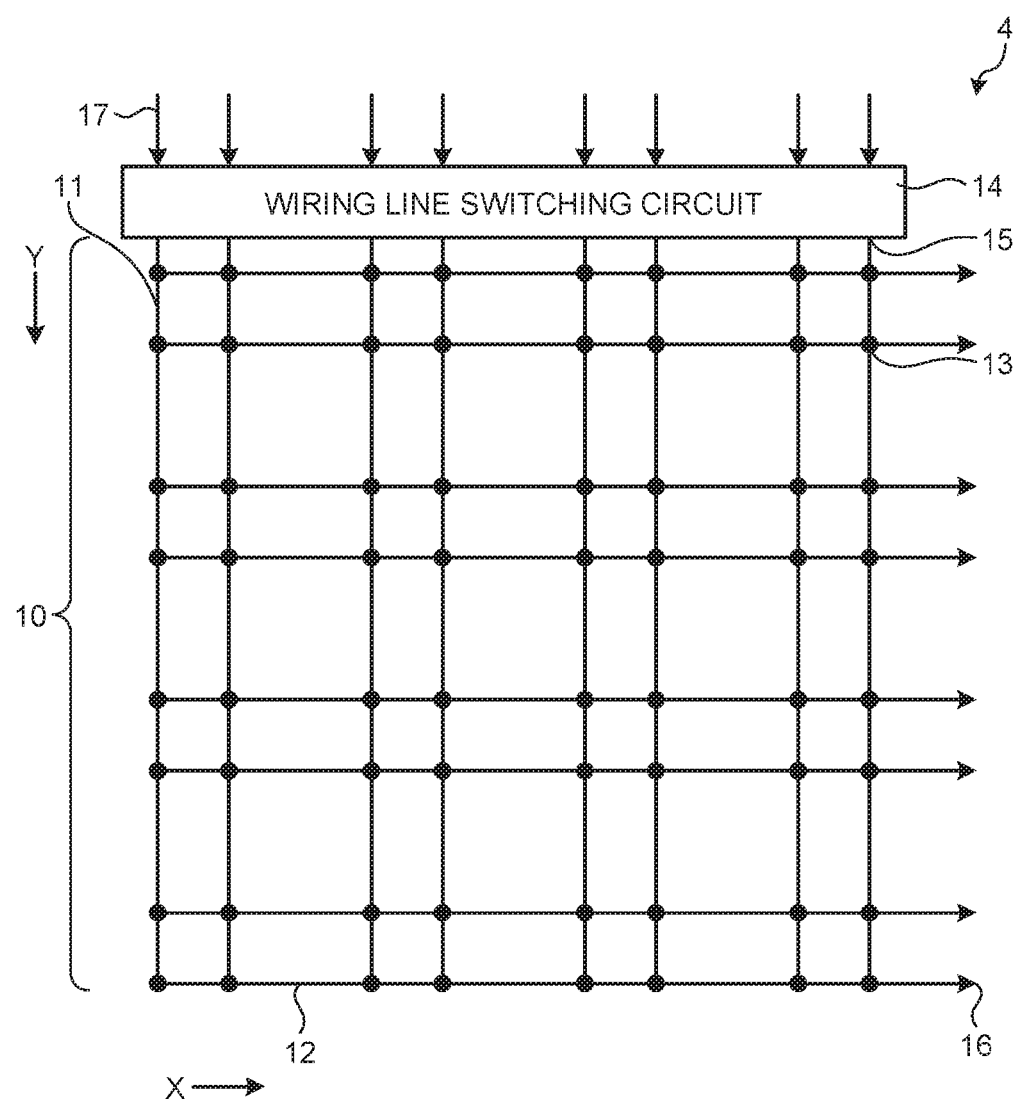
FIG. 2 is a view showing a crossbar area and a wiring line switching circuit in the routing module shown in FIG. 1.

FIG. 2 is a view showing the crossbar area and the wiring line switching circuit in the routing module 4. The crossbar area 10 includes a plurality of wiring lines 11 and 12 and a plurality of switches 13. The plurality of wiring lines 11 and the plurality of wiring lines 12 are arrayed in a lattice state. The plurality of wiring lines 11 are arranged in a column direction. The plurality of wiring lines 12 are arranged in a row direction. The number of the wiring lines 11 and 12 and the number of the switches 13 are not limited to the numbers shown in FIG. 2 but are arbitrary.

Each of the wiring lines 11 serving as a first wiring line has an input end 15 to which a signal from a first element is input. The first element is an element that transmits a signal to be input into the routing module 4, and it corresponds to one of the logic blocks 2 and I/Os 5 present around the routing module 4, or the processing module 3.

Each of the wiring lines 12 serving as a second wiring line has an output end 16 from which a signal is output to a second element. The second element is an element that receives a signal output from the routing module 4, and it corresponds to one of the logic blocks 2 and I/Os 5 present around the routing module 4, or the processing module 3. The routing module 4 outputs signals input from first elements to second elements.

In FIG. 2, all the input directions into the crossbar area 10 of each of the routing modules 4 are shown in the same way as a Y-axis direction. Further, in FIG. 2, all the output directions from the crossbar area 10 of each of the routing modules 4 are shown in the same way as an X-axis direction. The X-axis and the Y-axis are two axes perpendicular to each other. The plurality of wiring lines 11 are set in parallel with the Y-axis, and the wiring lines 12 are set in parallel with the X-axis.

The switches 13 are respectively disposed at the intersection points between the wiring lines 11 and the wiring lines 12. Each of the switches 13 switches the connection and disconnection between a wiring line 11 and a wiring line 12. The switch 13 includes a transistor arranged to switch the transmittal and blockade of a signal.

The CM 8 shown in FIG. 1 is formed of a group of memories respectively disposed in the switches 13. The CM 8 holds data for instructing driving of the connection and disconnection to each of the switches 13. The switch 13 switches the connection and disconnection in accordance with data written in the memory by rewriting the data in the CM 8.

Figure 3:
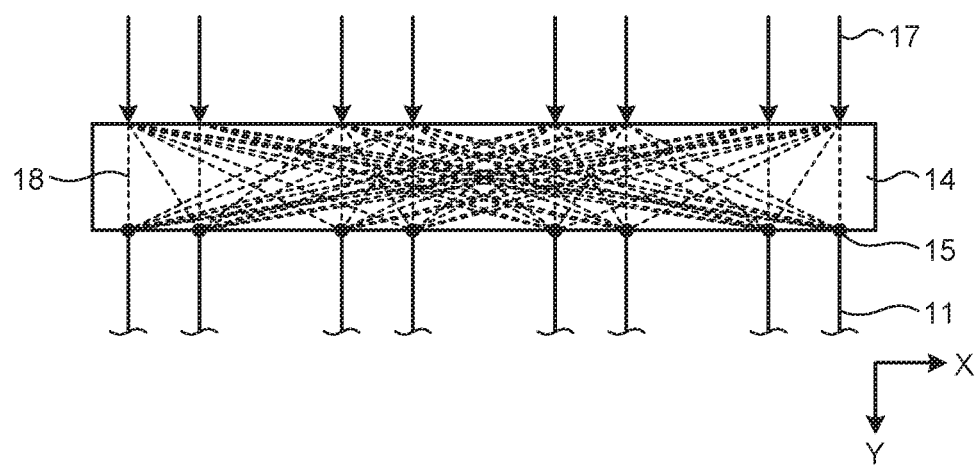
FIG. 3 is a view showing a first example of the wiring line switching circuit.

FIG. 3 is a view showing a first example of the wiring line switching circuit 14. The wiring line switching circuit 14 is interposed between input signal lines 17 and the input ends 15 of the wiring lines 11. Each of the input signal lines 17 is a signal line for transmitting a signal input from a first element into the routing module 4. The wiring line switching circuit 14 switches input ends 15 to connect with input signal lines 17, and thereby switches wiring lines 11 for transmitting signals from first elements, among the plurality of wiring lines 11.

The wiring line switching circuit 14 includes links 18 that connect each of the input signal lines 17 to all the input ends 15. The wiring line switching circuit 14 can switch the transmittal and blockade of a signal at each of the links 18. The wiring line switching circuit 14 can switch the connection and disconnection of each one of the first elements with respect to all the input ends 15.

The wiring line switching circuit 14 has a structure of a so-called fully connected network, in which the links 18 are branched from each of the input signal lines 17 to all the input ends 15. However, the wiring line switching circuit 14 may have a structure of a so-called multi stage network, in which a plurality of arrays of small scale branches arranged in parallel are disposed between the input signal lines 17 and the input ends 15.

The wiring line switching circuit 14 may be designed such that each of the input ends 15 is provided with a selection circuit. The selection circuit is formed to select an input signal line 17 for transmitting a signal to the input end 15, among all the input signal lines 17. The wiring line switching circuit 14 may have any structure that can switch wiring lines 11 for transmitting signals from first elements.

Figure 4:
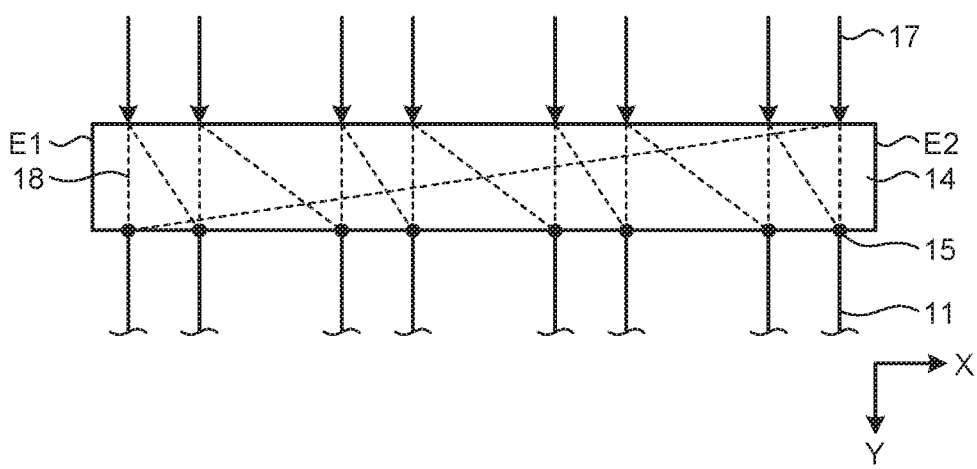
FIG. 4 is a view showing a second example of the wiring line switching circuit.

The wiring line switching circuit 14 may be designed such that the links 18 are partly omitted. FIG. 4 is a view showing a second example of the wiring line switching circuit 14. The second example of the wiring line switching circuit 14 includes links 18 that connect each of the input signal lines 17 to two input ends 15. In this wiring line switching circuit 14, the links 18 can switch the connection and disconnection of each one of the first elements with respect to two input ends 15 adjacent to each other.

Here, the opposite ends of the wiring line switching circuit 14 in the X-axis direction will be respectively referred to as a first end E1 and a second end E2, and, in the second example, one of the input signal lines 17 closest to the second end E2 will be referred to as a terminal end signal line.

Each of the input signal lines 17 other than the terminal end signal line is provided with a link 18 for sending a signal straight to one of the input ends 15 and a link 18 for shifting the signal to adjacent one of the input ends 15 on the second end E2 side of the former one of the input ends 15. The terminal end signal line is provided with a link 18 for sending a signal straight to one of the input ends 15 and a link 18 for sending a signal to one of the input ends 15 closest to the first end E1.

The wiring line switching circuit 14 includes links 18 each branched from one input signal line 17 to two input ends 15. The wiring line switching circuit 14 may be designed such that each of the input ends 15 is provided with a selection circuit. The selection circuit is formed to select an input signal line 17 for transmitting a signal to the input end 15, from the two input signal lines 17.

Figure 5:
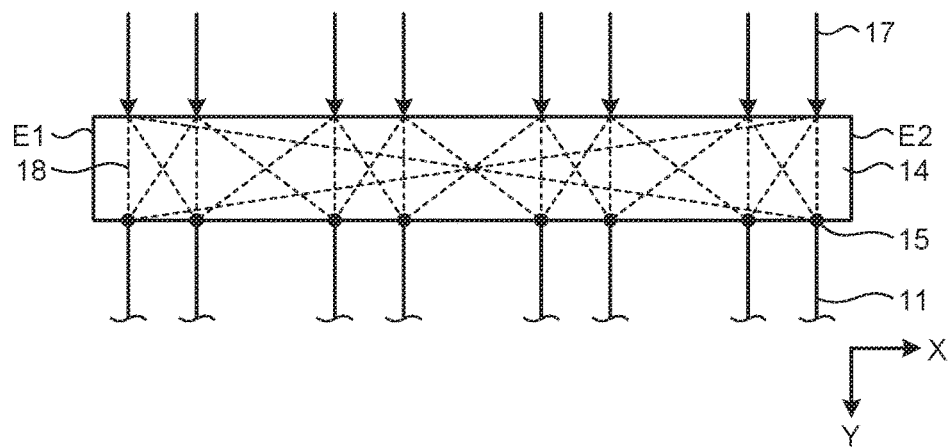
FIG. 5 is a view showing a third example of the wiring line switching circuit.

FIG. 5 is a view showing a third example of the wiring line switching circuit 14. The third example of the wiring line switching circuit 14 includes links 18 that connect each of the input signal lines 17 to three input ends 15. In this wiring line switching circuit 14, the links 18 can switch the connection and disconnection of each one of the first elements with respect to three input ends 15.

In the third example, one of the input signal lines 17 closest to the first end E1 will be referred to as a first terminal end signal line, and one of the input signal lines 17 closest to the second end E2 will be referred to as a second terminal end signal line. Each of the input signal lines 17 other than the first and second terminal end signal lines is provided with a link 18 for sending a signal straight to one of the input ends 15 and two links 18 for shifting the signal to adjacent ones of the input ends 15 respectively on the first end E1 side and second end E2 side of the former one of the input ends 15.

The first terminal end signal line is provided with a link 18 for sending a signal straight to one of the input ends 15 and a link 18 for shifting the signal to adjacent one of the input ends 15 on the second end E2 side of the former one of the input ends 15. Further, the first terminal end signal line is provided with a link 18 for sending the signal to one of the input ends 15 closest to the second end E2.

The second terminal end signal line is provided with a link 18 for sending a signal straight to one of the input ends 15 and a link 18 for shifting the signal to adjacent one of the input ends 15 on the first end E1 side of the former one of the input ends 15. Further, the second terminal end signal line is provided with a link 18 for sending the signal to one of the input ends 15 closest to the first end E1.

The wiring line switching circuit 14 includes links 18 each branched from one input signal line 17 to three input ends 15. The wiring line switching circuit 14 may be designed such that each of the input ends 15 is provided with a selection circuit. The selection circuit is formed to select an input signal line 17 for transmitting a signal to the input end 15, from the three input signal lines 17. According to the second and third examples of the wiring line switching circuit 14, the links 18 are partly omitted and thereby a simpler and smaller scale circuit constitution is provided, as compared with the first example of the wiring line switching circuit 14.

The constitution of the wiring line switching circuit 14 is not limited to the constitutions of the first to third examples, but may be suitably modified. The wiring line switching circuit 14 may have any constitution that can switch wiring lines 11 for transmitting signals.

The CM 9 shown in FIG. 1 holds data for instructing driving of the wiring line switching circuit 14. The wiring line switching circuit 14 switches input ends 15 to connect with first elements, by rewriting the data in the CM 9.

Each of the CMs 7, 8, and 9 is formed of an SRAM (static random access memory), for example. Each of the CMs 7, 8, and 9 may be formed of a nonvolatile memory, such as a flash memory or EEPROM (electrically erasable and programmable read only memory).

The configuration driver 6 performs configuration of the processing module 3 and the routing module 4. In this embodiment, the "configuration" means a process of writing data into the CMs 7, 8, and 9. Further, the configuration driver 6 includes a function as a controller for controlling driving of the switches 13 and wiring line switching circuit 14.

Every time the FPGA 1 is activated, the configuration driver 6 reads in configuration bits (config. bits) and fault information (fault info.). The configuration bits include data for setting a calculating operation function in the processing module 3 and data for setting signal transmission routes in the routing module 4.

EDA (electronic design automation) generates configuration bits for an application designed by a user or application vendor of the FPGA 1. The EDA is formed of a computer including installed software for designing logic circuits, for example. The FPGA 1 reads in configuration bits from the EDA.

The fault information is information about occurrence of faults in the switches 13. For example, during an inspection step in the process of manufacturing the FPGA 1, a test for obtaining the fault information is performed. The fault information is provided to a user of the FPGA 1 by use of a storage medium or communication means. The user of the FPGA 1 causes the FPGA 1 to read in the fault information thus provided. With this operation, the FPGA 1 obtains the fault information for compensating for faults found during the manufacturing process. The fault information may be formed of information created by any method. Further, the FPGA 1 may obtain fault information for compensating for a fault newly generated after the start of an operation, in addition to the initial defects found from the manufacturing process.

The configuration driver 6 rewrites the read configuration bits, based on a result obtained by analyzing the fault information. The configuration driver 6 outputs a configuration error (config. error), when an error occurs in configuration.

Figure 6:
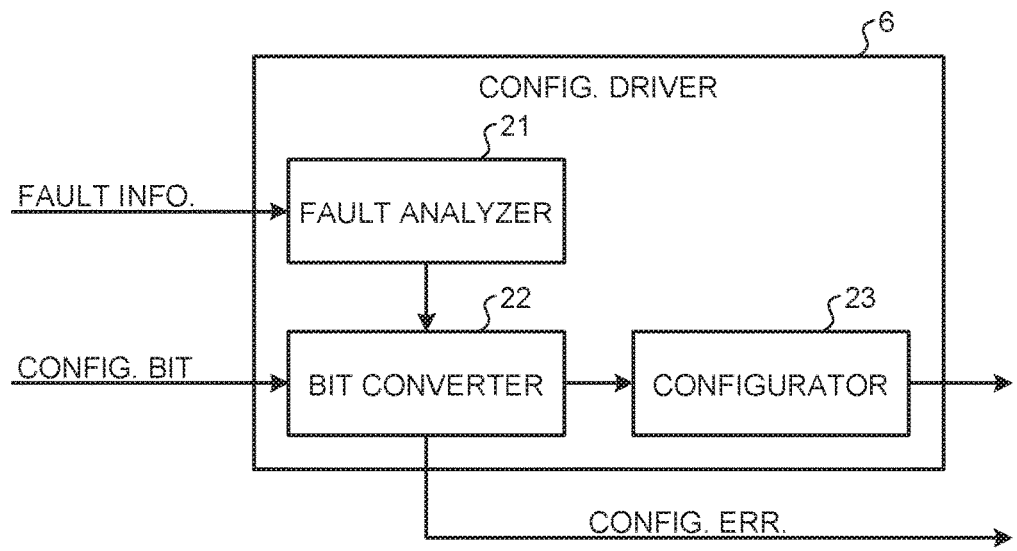
FIG. 6 is a block diagram showing a configuration driver shown in FIG. 1.

FIG. 6 is a block diagram showing the configuration driver 6. The configuration driver 6 includes a fault analyzer 21, a bit converter 22, and a configurator 23.

The fault analyzer 21 analyzes the contents of the input fault information. The fault analyzer 21 outputs the analyzed result to the bit converter 22.

The bit converter 22 rewrites the input configuration bits, in accordance with the analyzed result obtained by the fault analyzer 21. Further, the bit converter 22 outputs the configuration error.

The configurator 23 sends the configuration bits from the bit converter 22 to each of the logic blocks 2. The configurator 23 sends the configuration bits to the CMs 7, 8, and 9 of each of the logic blocks 2 by use of serial transfer. Here, the configurator 23 may be set to send the configuration bits to the CMs 7, 8, and 9 of each of the logic blocks 2 via any transfer route.

Figure 7:
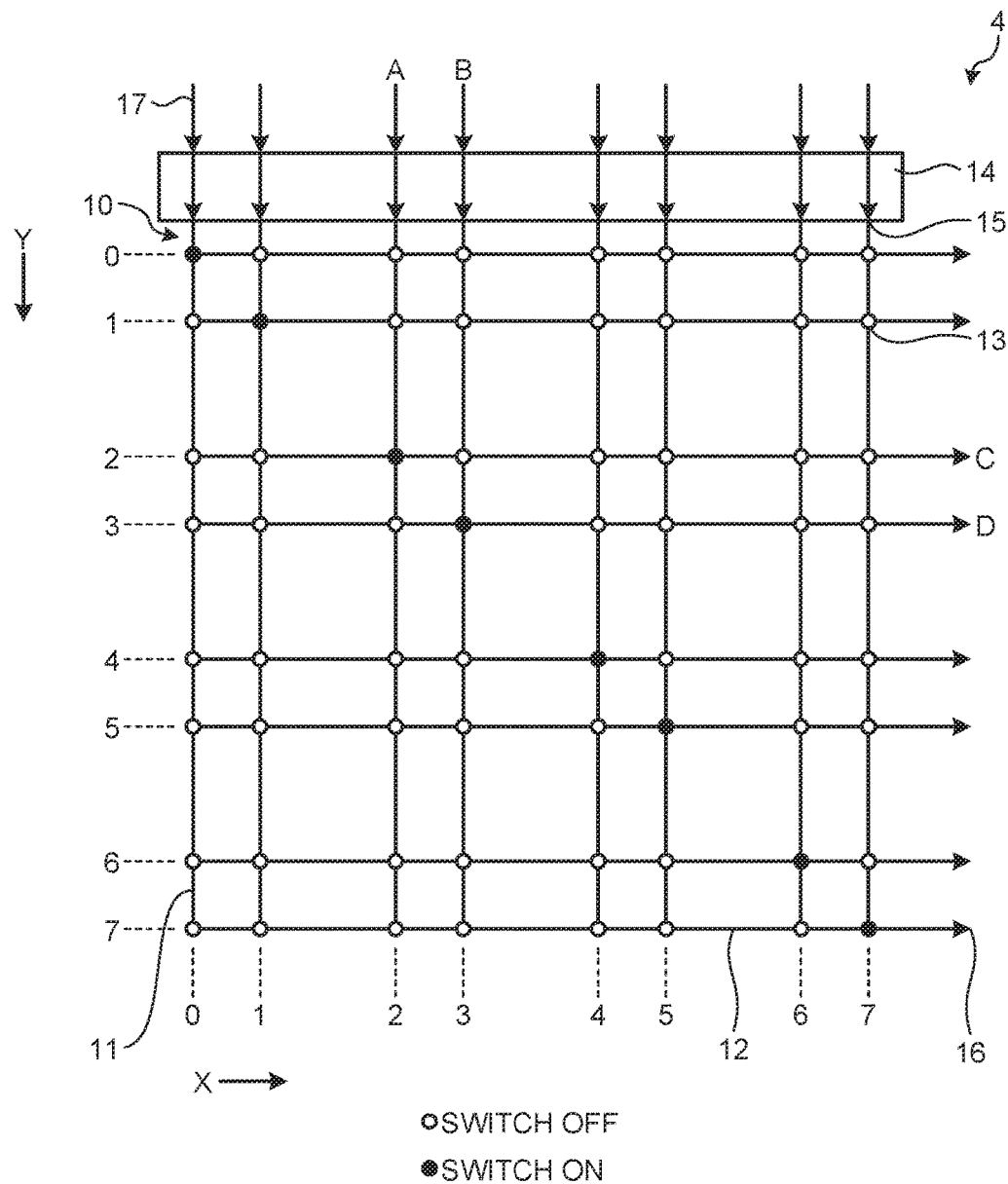
FIG. 7 is a view showing a state of the wiring line switching circuit and switches in a case where the routing module operates normally.

Next, an explanation will be given of an operation of the routing module 4. FIG. 7 is a view showing a state of the wiring line switching circuit 14 and switches 13 in a case where the routing module 4 operates normally. The case where the routing module 4 operates normally means a case where no fault is present in the switches 13.

In the crossbar area 10, two-dimensional coordinates (X-Y coordinates) are preset. X=0 represents a position on one of the wiring lines 11 most distant from the output ends 16 of the wiring lines 12. Each of the wiring lines 11 and input signal lines 17 is identified by the X coordinate. Y=0 represents a position on one of the wiring lines 12 closest to the input ends 15 of the wiring lines 11. Each of the wiring lines 12 is identified by the Y coordinate. For example, (0,1) represents the position of the intersection point between the wiring line 11 at X=0 and the wiring line 12 at Y=1.

In the following description, the plus X direction is defined by a direction in which the X coordinate increases. The minus X direction is defined by a direction in which the X coordinate decreases. The plus Y direction is defined by a direction in which the Y coordinate increases. The minus Y direction is defined by a direction in which the Y coordinate decreases.

In FIG. 7, a black colored switch 13 is assumed to be in an ON state where it connects a wiring line 11 and a wiring line 12 to each other. A white colored switch 13 is assumed to be in an OFF state where it disconnects a wiring line 11 and a wiring line 12 from each other. In the routing module 4 shown in FIG. 7, eight transmission routes are built to transmit signals from the input signal lines 17 at X=0, 1, . . . 7 respectively to the output ends 16 at Y=0, 1, . . . 7, in accordance with configuration bits.

FIG. 8 is a view showing an example of configuration bits to be written into the CM 9 in a case where the routing module 4 operates normally. Here, in this example, the wiring line switching circuit 14 is formed of the third example shown in FIG. 5.

The configuration bits for the wiring line switching circuit 14 are assumed to be an array of pieces of 2-bit data respectively set to the input signal lines 17, for example. In the configuration bits, a pattern of connection between an input signal line 17 and an input end 15 is defined by each of the pieces of 2-bit data. By use of the 2-bit data, it is possible to express four different connection patterns at most.

For example, 2-bit data "00" denotes that a signal from an input signal line 17 is to be sent straight. When "00" is set on an input signal line 17, the wiring line switching circuit 14 brings, into the connected state, the link 18 between this input signal line 17 and an input end 15 having the same X coordinate value as this input signal line 17.

"01" denotes that a signal from an input signal line 17 is to be shifted by one coordinate value in the plus X direction. When "01" is set on an input signal line 17, the wiring line switching circuit 14 brings, into the connected state, the link 18 between this input signal line 17 and an input end 15 having an X coordinate value obtained by adding one to the X coordinate value of this input signal line 17.

"10" denotes that a signal from an input signal line 17 is to be shifted by one coordinate value in the minus X direction. When "10" is set on an input signal line 17, the wiring line switching circuit 14 brings, into the connected state, the link 18 between this input signal line 17 and an input end 15 having an X coordinate value obtained by subtracting one from the X coordinate value of this input signal line 17.

"11" denotes that an input signal line 17 is to be isolated from all the input ends 15. When "11" is set on an input signal line 17, the wiring line switching circuit 14 brings all the links 18 from this input signal line 17 into the disconnected state.

Here, the definition of configuration bits for the wiring line switching circuit 14 is not limited to that described in the embodiment but is arbitrary. The configuration bits may be formed of any bit data that can express connection patterns between the input signal lines 17 and the input ends 15. The bit data for expressing connection patterns is not limited to 2-bit data. The number of bits may be suitably set in accordance with the number of connection patterns.

In the configuration bits of the example shown in FIG. 8, all the input signal lines 17 at X=0, 1, . . . 7 are set with "00". The configuration driver 6 generates such configuration bits, when no fault is present in any of the switches 13.

The configuration bits shown in FIG. 8 are written into the CM 9. Consequently, as shown in FIG. 7, the wiring line switching circuit 14 sends signals from the respective input signal lines 17 straight to input ends 15 having the same X coordinate values as the respective input signal lines 17.

FIG. 9 is a view showing an example of configuration bits to be written into the CM 8 in a case where the routing module 4 operates normally. For example, the configuration bits for the switches 13 are assumed to be an array of pieces of 1-bit data respectively set to the switches 13. In the configuration bits, one of the connection (ON) and disconnection (OFF) of a switch 13 is defined by each of the pieces of 1-bit data. For example, 1-bit data "0" represents OFF, and "1" represents ON.

In the configuration bits of the example shown in FIG. 9, the eight switches 13 at (X,Y)=(0,0), (1,1), (7,7) are set with "1". The other switches 13 are set with "0". The configuration driver 6 outputs the input configuration bits as they are, when no fault is present in any of the switches 13.

The configuration bits shown in FIG. 9 are written into the CM 8. Consequently, as shown in FIG. 7, the eight switches 13 at (0,0), (1,1), . . . (7,7) come into the ON state. The other switches 13 come into the OFF state.

For example, it is assumed that a signal from a first element "A" is input through the input signal line 17 at X=2 into the routing module 4. The wiring line switching circuit 14 sends this signal straight to the input end 15 at X=2. The signal passes through the wiring line 11 at X=2, and is input from the switch 13 at (2,2) into the wiring line 12 at Y=2. The signal passes through the wiring line 12 at Y=2, and is output to a second element "C".

It is assumed that a signal from a first element "B" is input through the input signal line 17 at X=3 into the routing module 4. The wiring line switching circuit 14 sends this signal straight to the input end 15 at X=3. The signal passes through the wiring line 11 at X=3, and is input from the switch 13 at (3,3) into the wiring line 12 at Y=3. The signal is transmitted through the wiring line 12 at Y=3, and is output to a second element "D".

Figure 10:
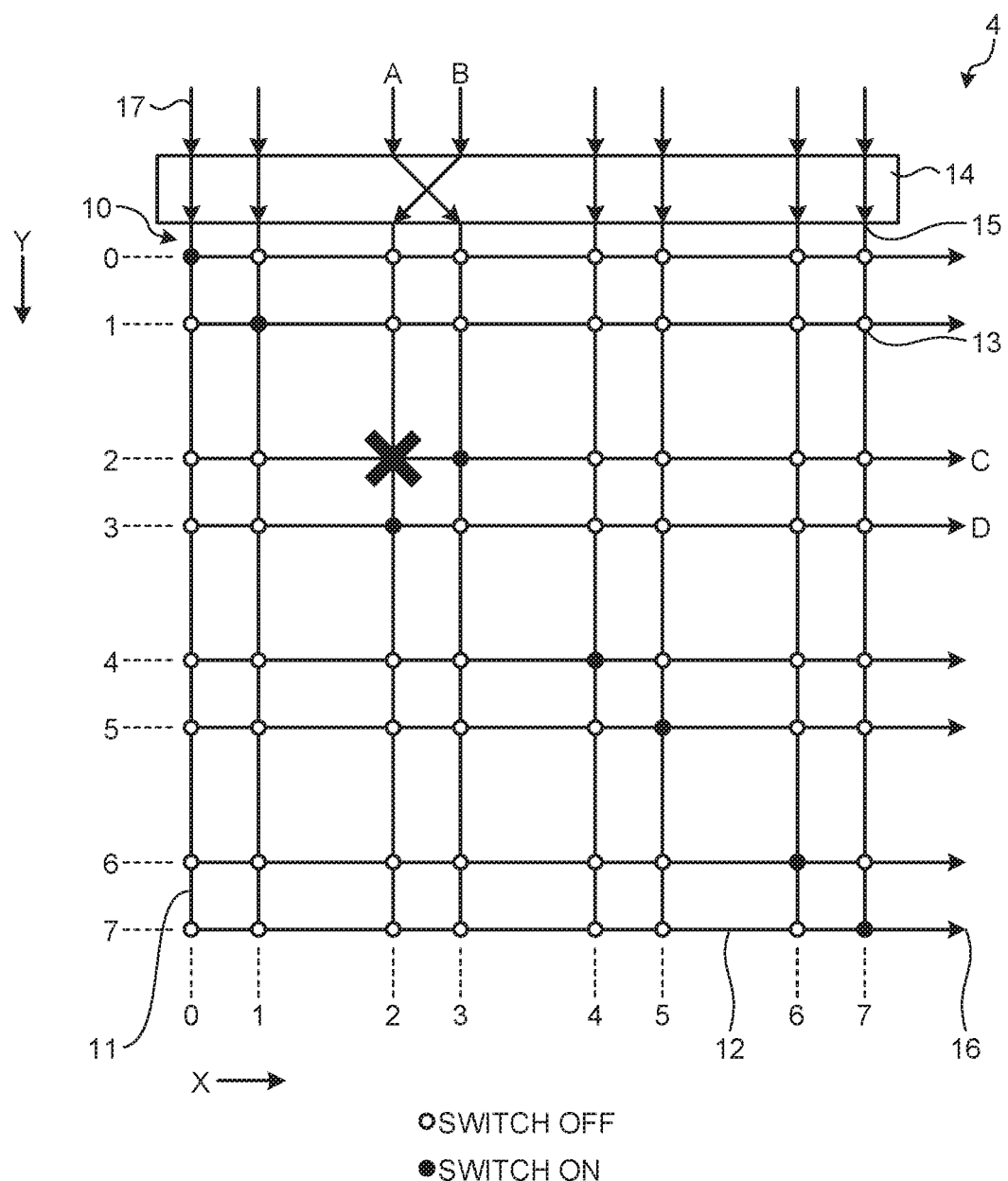
FIG. 10 is a view showing a state of the wiring line switching circuit and switches in a case where a fault has occurred in a switch.

FIG. 10 is a view showing a state of the wiring line switching circuit 14 and switches 13 in a case where a fault has occurred in a switch 13. FIG. 10 shows the routing module 4 in a state where a fault has occurred in one of the switches 13 shown in FIG. 7.

The fault of a switch 13 means an operational defect that makes a state where the switch 13 is not correctly switched in accordance with the configuration bits input in the CM 8. The fault of a switch 13 includes a structural defect about switching of the transmittal and blockade of a signal and a defect about propagation of a signal from the CM 8 to the switch 13.

In the example shown in FIG. 10, it is assumed that an open fault has occurred in the switch 13 at (2,2). The open fault is a fault that makes a state where the switch 13 remains OFF and cannot be operated. The routing module 4 switches a route that uses the switch 13 at (2,2), to another route.

FIG. 11 is a view showing an example of configuration bits to be written into the CM 9 in a case where a fault has occurred in a switch 13. The bit converter 22 makes changes in the configuration bits shown in FIG. 8, from "00" at X=2 and "00" at X=3 respectively to "01" and "10". The bit converter 22 maintains the bit data "00" of the other input signal lines 17 without changes.

The configuration bits shown in FIG. 11 are written into the CM 9. Consequently, as shown in FIG. 10, the wiring line switching circuit 14 sends a signal from the input signal line 17 at X=2 to the input end 15 at X=3. Further, the wiring line switching circuit 14 sends a signal from the input signal line 17 at X=3 to the input end 15 at X=2.

FIG. 12 is a view showing an example of configuration bits to be written into the CM 8 in a case where a fault has occurred in a switch 13. The bit converter 22 makes changes in the configuration bits shown in FIG. 9, from "0" at (2,3) to "1", from "0" at (3,2) to "1", and from "1" at (3,3) to "0". The bit converter 22 does not change the bit data of the other switches 13 in which a fault has not occurred. The bit converter 22 may change the bit data of a switch 13 in which a fault has occurred, or may leave the bit data unchanged.

The configuration bits shown in FIG. 12 are written into the CM 8. Consequently, the switches 13 at (2,3) and (3,2) are switched from OFF to ON. The switch 13 at (3,3) is switched from ON to OFF.

As in the case shown in FIG. 7, it is assumed that a signal from a first element "A" is input through the input signal line 17 at X=2 into the routing module 4. The wiring line switching circuit 14 sends this signal to the input end 15 at X=3. The signal passes through the wiring line 11 at X=3, and is input from the switch 13 at (3,2) into the wiring line 12 at Y=2. The signal passes through the wiring line 12 at Y=2, and is output to a second element "C".

As in the case shown in FIG. 7, it is assumed that a signal from a first element "B" is input through the input signal line 17 at X=3 into the routing module 4. The wiring line switching circuit 14 sends this signal to the input end 15 at X=2. The signal passes through the wiring line 11 at X=2, and reaches the switch 13 at (2,3). The signal is input from the switch 13 at (2,3) into the wiring line 12 at Y=3. The signal passes through the wiring line 12 at Y=3, and is output to a second element "D".

As described above, in the example shown in FIG. 10, the wiring line switching circuit 14 exchanges wiring lines 11 for transmitting signals input from the input signal lines 17 at X=2 and 3. Along with this exchange of wiring lines 11, the routing module 4 switches the ON and OFF of switches 13. Consequently, the routing module 4 switches signal transmission routes.

In order to transmit a signal from the "A", the routing module 4 uses, in place of the faulty switch 13 at (2,2), the switch 13 at (3,2) that is not used if the fault is not present. In order to use the switch 13 at (3,2) to transmit the signal from the "A", the routing module 4 switches the connection destination of the signal from the "A", to the input end 15 at X=3, by the wiring line switching circuit 14. Consequently, the routing module 4 ensures a route for the signal input from the "A" through the input signal line 17 at X=2 such that this signal is output from the output end 16 at Y=2 to the "C".

Further, the routing module 4 switches the connection destination of the signal from the "B", to the input end 15 at X=2, by the wiring line switching circuit 14. Further, the routing module 4 sets the two switches 13 at (2,3) and (3,3) respectively to ON and OFF to send the signal from the wiring line 11 at X=2 to the output end 16 at Y=3. Consequently, the routing module 4 ensures a route for the signal input from the "B" through the input signal line 17 at X=3 such that this signal is output from the output end 16 at Y=3 to the "D". Thus, the transmission route for the signal from the "A" and the transmission route for the signal from the "B" are prevented from being short-circuited therebetween.

The routing module 4 switches signal transmission routes as described above so that it can transmit signals from first elements to second elements as in a case where no fault is present. The FPGA 1 can operate normally in accordance with user's programming by avoiding a fault generated in the routing module 4.

The FPGA 1 operates normally even if a fault is present in the routing module 4, and thereby it can provide high reliability. The FPGA 1 reduces the occurrence frequency of a defective product caused by a fault in the routing module 4, and thereby it can improve the process yield and reduce the manufacturing cost.

In the crossbar area 10, there are switches 13 not used for connection between a wiring-line 11 and a wiring-line 12 on each of the routes formed within the crossbar area 10. For example, in the case of the normal operation shown in FIG. 7, all the switches 13 other than the eight switches 13 at (0,0), (1,1), ... (7,7) are not used.

If a fault has occurred in a switch 13 supposed to be used, the routing module 4 rebuilds a transmission route by utilizing a switch 13 supposed to be not used. The FPGA 1 can easily perform an operation for fault avoidance, by rewriting configuration bits for switching of switches 13 and for switching of wiring lines 11.

The routing module 4 rebuilds transmission routes by use of wiring lines 11 and 12 and switches 13 existing in the crossbar area 10. The FPGA 1 builds transmission routes for fault avoidance by use of structures included in the routing module 4. The FPGA 1 can perform fault avoidance without the premise that there are disposed redundant structures or spare elements on purpose to substitute a local faulty portion. Thus, the FPGA 1 can reduce the circuit scale as compared with a case where the redundant structures or spare elements are indispensable.

The crossbar area 10 includes a large number of switches 13 supposed to be not used, and so the routing module 4 can perform flexible switching of transmission routes even if a plurality of faults have occurred in the crossbar area 10. The FPGA 1 can achieve flexible fault avoidance by use of a small scale circuit constitution, as compared with a case where a large number of redundant structures are disposed on the assumption that a plurality of faults will occur.

The FPGA 1 performs avoidance of a fault of a switch 13 generated in the routing module 4 by use of structures included in the routing module 4. The change of transmission routes for the fault avoidance is restricted within the routing module 4 where the fault has occurred. On the other hand, as a tentative example, if the fault avoidance is performed by switching in units of the logic block 2, the change of transmission routes comes to be made beyond the routing module 4 where the fault has occurred. Accordingly, the FPGA 1 can reduce the change of transmission routes, as compared with a case where the switching is performed in units of the logic block 2.

In the logic structure programmed in the FPGA 1, the mapping of transmission routes has been optimized to satisfy desired transmission performance. Even if a fault has occurred in the optimized transmission routes, the FPGA 1 can reduce an influence on the transmission speed, given by switching of transmission routes. Consequently, the FPGA 1 can suppress deterioration of the transmission performance caused by fault avoidance.

In the example shown in FIG. 10, when a fault generated in the switch 13 at (2,2) is a closed fault, the routing module 4 does not need to switch signal transmission routes. The closed fault is a fault that makes a state where the switch 13 remains ON and cannot be operated. In this case, the routing module 4 can control the wiring line switching circuit 14 and the switches 13, as in a case where no fault is present in the switches 13, to transmit signals from first elements to second elements.

Figure 13:
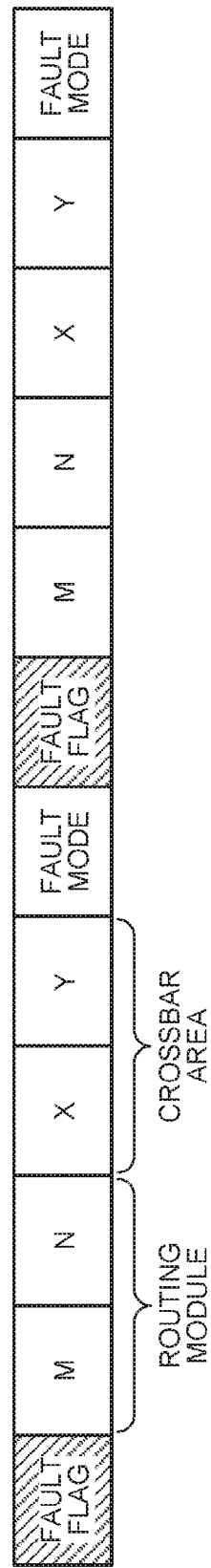
FIG. 13 is a view showing an example of a data structure of fault information.

FIG. 13 is a view showing an example of a data structure of fault information. In the FPGA 1, two-dimensional coordinates (M,N) are set in each of the logic blocks 2 (each of the routing modules 4). The M coordinate denotes a position in a first direction of the two-dimensional directions. The N coordinate denotes a position in a second direction perpendicular to the first direction.

The fault information is assumed to be formed such that unit data rows of respective faulty switches 13 are arranged in parallel. The unit data row includes pieces of data about a fault flag, M and N coordinate values of a routing module 4, X and Y coordinate values in a crossbar area 11, and a fault mode. The unit data row is formed of a bit row having a specific bit length.

The fault flag is a flag denoting whether a data row indicating a fault is included after this fault flag. For example, a flag "1" denotes that a data row indicating a fault is included after this flag. "0" denotes that a data row indicating a fault is not included after this flag.

The M and N coordinate values represent the position of a routing module 4 including a switch 13 in which a fault has occurred. The X and Y coordinate values represent the position of the switch 13 within this routing module 4. According to the fault information, a faulty switch 13 is identified by coordinate values (M,N) and coordinate values (X,Y).

The fault mode represents the type of a fault. For example, "0" represents an open fault, and "1" represents a closed fault.

If the fault analyzer 21 detects a fault flag "1" from input fault information, it cuts out the unit data row subsequent to this fault flag "1". The fault analyzer 21 sends the analysis result, which is the unit data row thus cut out, to the bit converter 22.

The fault analyzer 21 repeats the cutting out of a unit data row and the outputting of an analysis result to the bit converter 22, until a fault flag "0" is detected. Since the fault information includes a fault flag, the fault analyzer 21 can easily determine the presence or absence of a fault.

Figure 14:
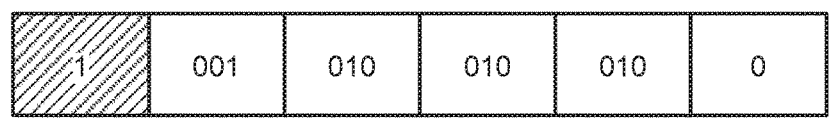
FIG. 14 is a view showing an example of a unit data row cut out by the fault analyzer shown in FIG. 6.

FIG. 14 is a view showing an example of a unit data row cut out as described above. "001" and "010" subsequent to a fault flag "1" represent the coordinate position (M,N)=(1, 2) of a routing module 4. "010" and "010" subsequent to them represent the coordinate position (X,Y)=(2,2) within the crossbar area 10. "0" at the end of the unit data row represents an open fault.

Based on this unit data row, the bit converter 22 grasps that an open fault has occurred in the switch 13 at (2,2) inside the routing module 4 at (1,2).

The bit converter 22 builds a transmission route for substituting a transmission route passing through a switch 13 in which a fault has occurred. At this time, the bit converter 22 determines a switch 13 for substituting this faulty switch 13, among the switches 13 supposed to be OFF by the configuration bits. Based on the contents of the unit data row, the bit converter 22 converts the configuration bit contents shown in FIGS. 8 and 9 into the contents shown in FIGS. 11 and 12, for example.

In a structure equipped with the first example of the wiring line switching circuit 14, the routing module 4 also can switch transmission routes, as in the structure equipped with the third example of the wiring line switching circuit 14.

Figure 15:
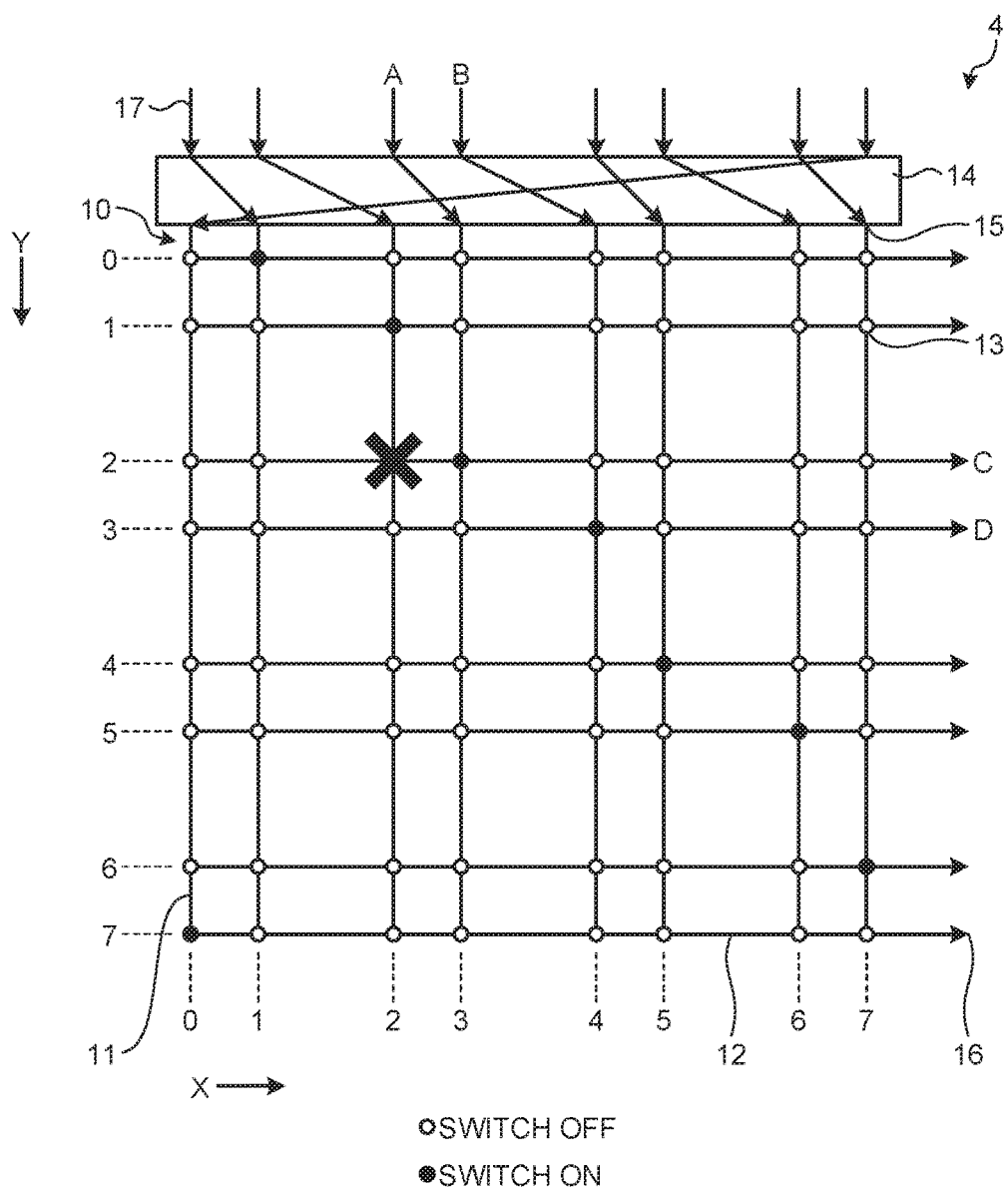
FIG. 15 is a view for explaining switching of transmission routes in a structure equipped with the second example of the wiring line switching circuit.

FIG. 15 is a view for explaining switching of transmission routes in a structure equipped with the second example of the wiring line switching circuit 14. In the example shown in FIG. 15, it is assumed that an open fault has occurred in the switch 13 at (2,2). Further, it is assumed that, if no fault is present in the switches 13, the routing module 4 is in the state shown in FIG. 7.

The wiring line switching circuit 14 sends signals from the input signal lines 17 at X=0 to 6 respectively to the input ends 15 at X=1 to 7. The wiring line switching circuit 14 sends a signal from the input signal line 17 at X=7 to the input end 15 at X=0.

The switches 13 at (0,0), (1,1), (3,3), . . . (7,7) are switched from ON to OFF. The switches 13 at (1,0), (2,1), . . . (7,6), (0,7) are switched from OFF to ON.

The routing module 4 switches transmission routes as described above so that it can transmit signals from first elements to second elements as in a case where no fault is present in the switches 13. When a fault has occurred in one switch 13, the routing module 4 equipped with the second example of the wiring line switching circuit 14 switches transmission routes for signals from all the input signal lines 17. On the other hand, in the case of the routing module 4 equipped with the first example or third example of the wiring line switching circuit 14, it can reduce the change of transmission routes. In the routing module 4, as the change of transmission routes initially set is smaller, deterioration of the transmission performance can be smaller.

When faults have occurred in a plurality of switches 13 inside the routing module 4, there may be a case that cannot build transmission routes capable of transmitting signals from first elements to second elements as in a case where no fault is present in the switches 13. If the bit converter 22 judges that transmission routes capable of avoiding a fault cannot be built, it outputs a configuration error.

The configuration driver 6 may be designed to output the configuration error from an element other than the bit converter 22. For example, in place of the bit converter 22, the fault analyzer 21 or configurator 23 may output the configuration error. A control section (not shown) for controlling the overall operation of the configuration driver 6 may output the configuration error. The FPGA 1 may perform an operation for fault avoidance by means of a manner other than switching of transmission routes within the routing module 4, in accordance with the configuration error.

Figure 16:
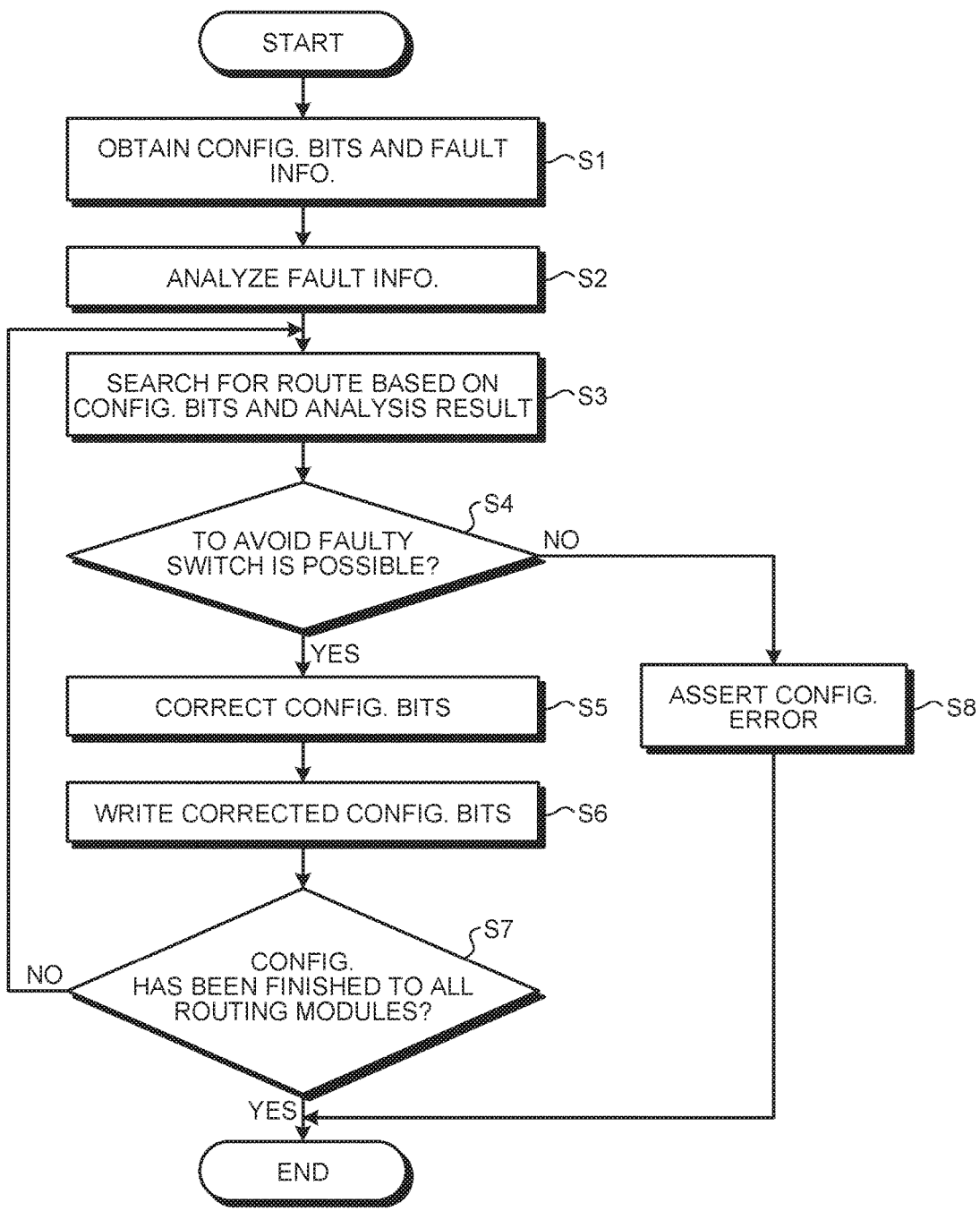
FIG. 16 is a flow chart for explaining an operation for fault avoidance performed by the FPGA according to the first embodiment.

FIG. 16 is a flow chart for explaining an operation for fault avoidance performed by the FPGA 1. When the FPGA 1 is activated, the configuration driver 6 obtains configuration bits, which are first information, and fault information, which is second information, (S1).

The fault analyzer 21 analyzes the obtained fault information (S2). The fault analyzer 21 detects the fault flag of each of the unit data rows of the fault information. If the fault analyzer 21 detects a fault flag "1", it cuts out the unit data row subsequent to this fault flag "1". If the fault analyzer 21 detects a fault flag "0", it judges that a data row indicating a fault is not included after this fault flag "0", and finishes the analysis.

The bit converter 22 searches for a route for avoiding a faulty switch 13, based on the obtained configuration bits and the fault information analysis result (S3). The bit converter 22 identifies the faulty switch 13, based on coordinate data included in the unit data row cut out. The bit converter 22 identifies the type of a fault generated in this switch 13, based on a fault mode bit included in the unit data row.

The bit converter 22 identifies a route that cannot transmit a signal because of the fault, among the transmission routes built in accordance with the configuration bits. For example, with respect to the fault at (2,2) in the crossbar area 10 shown in FIG. 7, the bit converter 22 identifies the route from A to C, which is the route from the input signal line 17 at X=2 to the output end 16 at Y=2.

In association with the route thus identified, the bit converter 22 searches for a new route that can be made by switching using the wiring line switching circuit 14 and the switches 13. Further, in association with other routes affected by this switching, the bit converter 22 also searches for new routes.

For example, in the case of the route from A to C, the bit converter 22 sets a new route passing through the wiring line 11 at X=3 and the switch 13 at (3,2). In this respect, the route from B to D has been set originally to pass through the wiring line 11 at X=3, and so this route is affected by the switching performed for the route from A to C. Thus, in order to deal with the route from B to D, the bit converter 22 sets a new route passing through the wiring line 11 at X=2 and the switch 13 at (2,3).

In this way, the routing module 4 can maintain the initially set input/output relations by switching transmission routes within the logic block 2.

The bit converter 22 determines whether it is possible to avoid the faulty switch 13 by correcting the configuration bits in accordance with the search result (S4). If the bit converter 22 determines that avoidance of the faulty switch 13 is possible (S4, Yes), it corrects the configuration bits (S5).

The bit converter 22 outputs the corrected configuration bits to the configurator 23. The configurator 23 writes the corrected configuration bits into the CMs 8 and 9 (S6). The FPGA 1 performs the configuration from S3 to S6 for each of the routing modules 4.

The configuration driver 6 judges whether the configuration has been finished to all the routing modules 4 inside the FPGA 1 (S7). If there is a routing module 4 to which the configuration has not yet been finished (S7, No), the FPGA 1 repeats the operations from S3 for the routing module 4 to which the configuration has not yet been finished. If the configuration has been finished to all the routing modules 4 (S7, Yes), the FPGA 1 ends the operation for fault avoidance.

If the bit converter 22 determines that avoidance of the faulty switch 13 is impossible (S4, No), it regards that an error has occurred in the configuration. The bit converter 22 asserts a configuration error (S8), and the FPGA 1 ends the operation for fault avoidance. The FPGA 1 keeps the operation stopped until it receives an instruction for resetting the configuration error.

According to the first embodiment, the routing module 4 can rebuild transmission routes for fault avoidance, and thereby it can provide high reliability. The routing module 4 switches transmission routes by use of existing wiring lines 11 and 12 and switches 13, and thereby it can reduce the circuit scale. The change of transmission routes is restricted within the routing module 4 where a fault has occurred, and thereby the routing module 4 can suppress deterioration of the performance. Consequently, the FPGA 1 and the routing module 4 provide an effect capable of reducing the circuit scale and attaining high reliability and high performance.

Second Embodiment

Figure 17:
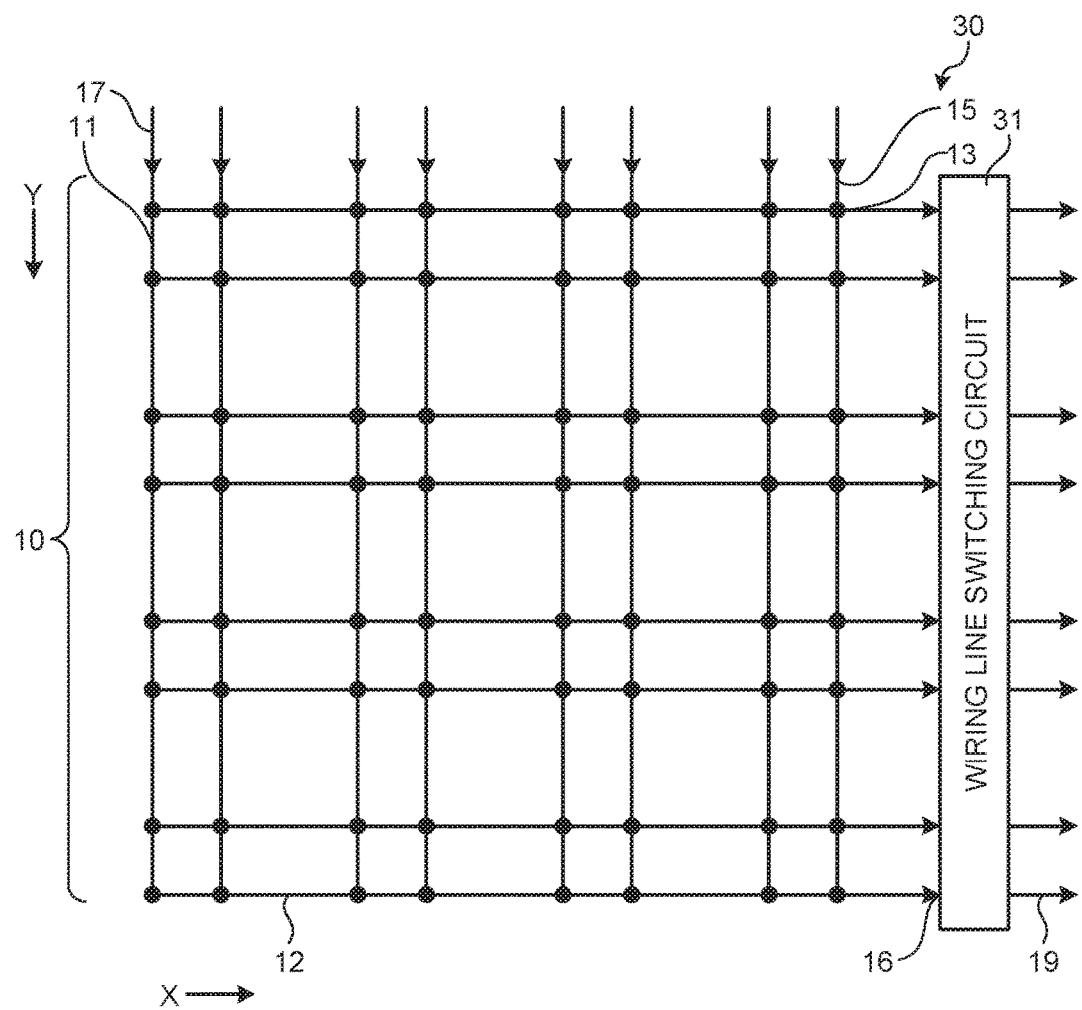
FIG. 17 is a view showing a routing module included in an FPGA according to a second embodiment.

FIG. 17 is a view showing a routing module included in an FPGA, which is a semiconductor apparatus according to a second embodiment. The constituent elements corresponding to those of the first embodiment are denoted by the same reference symbols, and their repetitive description will be omitted. The FPGA 1 according to the second embodiment includes a routing module 30 in place of the routing module 4 according to the first embodiment.

The routing module 30 includes a crossbar area 10 and a wiring line switching circuit 31. The crossbar area 10 includes a plurality of wiring lines 11 and 12 and a plurality of switches 13. The number of the wiring lines 11 and 12 and the number of the switches 13 included in the routing module 30 are not limited to the numbers shown in FIG. 17 but are arbitrary. Further, the routing module 30 includes CMs 8 and 9 as in the routing module 4 shown in FIG. 1.

The wiring line switching circuit 31 is interposed between the output ends 16 of the wiring lines 12 and output signal lines 19. Each of the output signal lines 19 is a signal line for transmitting a signal output from the routing module 30 to a second element. The wiring line switching circuit 31 switches output ends 16 to connect with output signal lines 19 based on the data in the CM 9, and thereby switches wiring lines 12 for transmitting signals to second elements.

The wiring line switching circuit 31 may have any constitution that can switch wiring lines 12 for transmitting signals. For example, the wiring line switching circuit 31 may have the same constitution as any one of the first to third examples of the wiring line switching circuit 14. The wiring line switching circuit 31 may include any one of a fully connected network, a multi stage network, and a selection circuit, as in the wiring line switching circuit 14.

Figure 18:
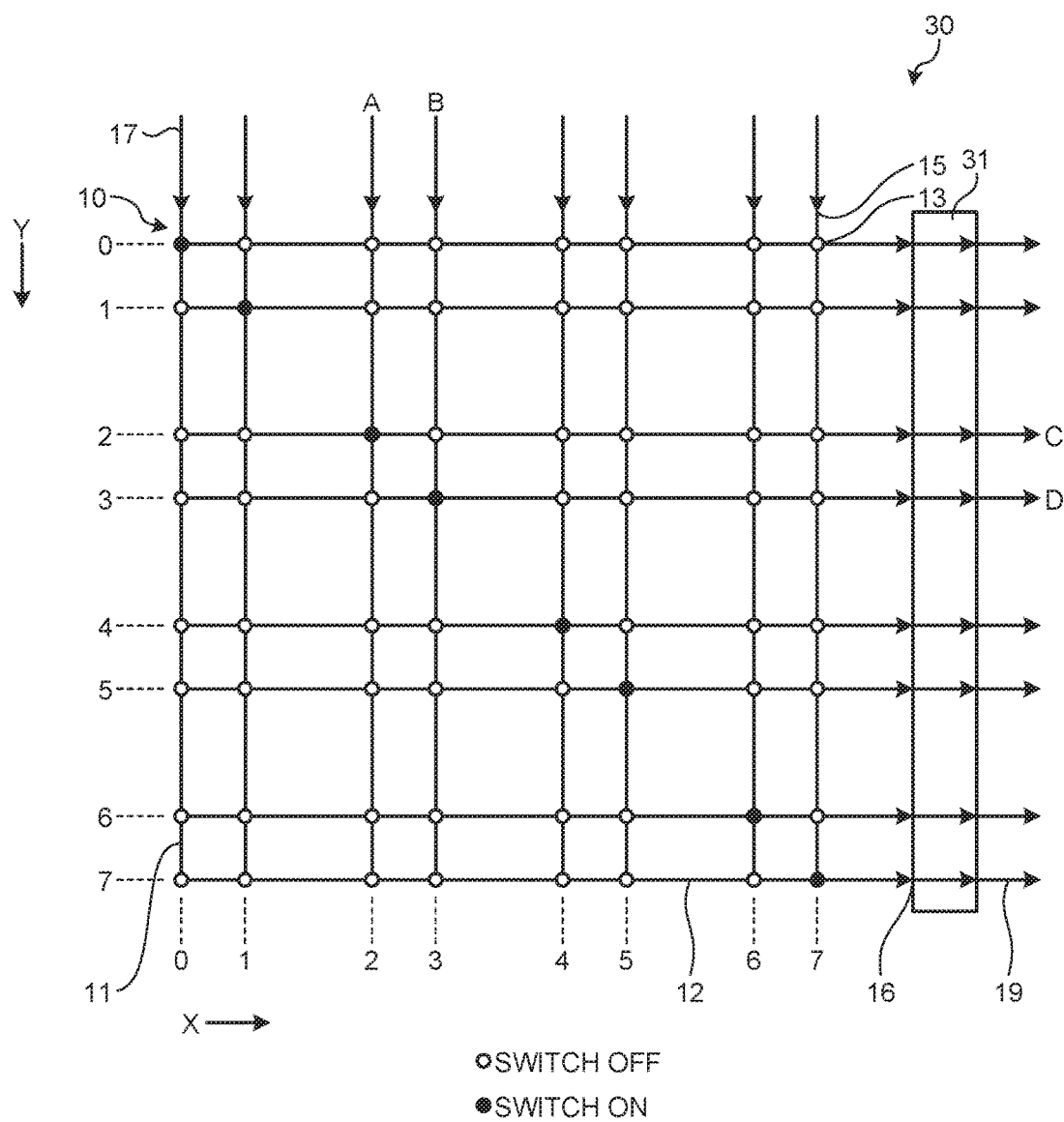
FIG. 18 is a view showing a state of the wiring line switching circuit and switches in a case where the routing module shown in FIG. 17 operates normally.

Next, an explanation will be given of an operation of the routing module 30. FIG. 18 is a view showing a state of the wiring line switching circuit 31 and switches 13 in a case where the routing module 30 operates normally.

In the example shown in FIG. 18, the wiring line switching circuit 31 sends signals from the respective output ends 16 straight to output signal lines 19 having the same Y coordinate values as the respective output ends 16. The switches 13 at (0,0), (1,1), . . . (7,7) come into the ON state. The other switches 13 come into the OFF state. The routing module 30 builds transmission routes for signals transmitted through the wiring lines 11 at X=0, 1, . . . 7 such that these signals are output respectively to the output signal lines 19 at Y=0, 1, . . . 7.

For example, a signal from a first element "A" passes through the wiring line 11 at X=2, and is input through the switch 13 at (2,2) into the wiring line 12 at Y=2. The wiring line switching circuit 31 sends the signal from the output end 16 at Y=2 straight to the output signal line 19 at Y=2. The signal passes through the output signal line 19 at Y=2, and proceeds to a second element "C".

A signal from a first element "B" passes through the wiring line 11 at X=3, and is input through the switch 13 at (3,3) in to the wiring line 12 at Y=3. The wiring line switching circuit 31 sends the signal from the output end 16 at Y=3 straight to the output signal line 19 at Y=3. The signal passes through the output signal line 19 at Y=3, and proceeds to a second element "D".

Figure 19:
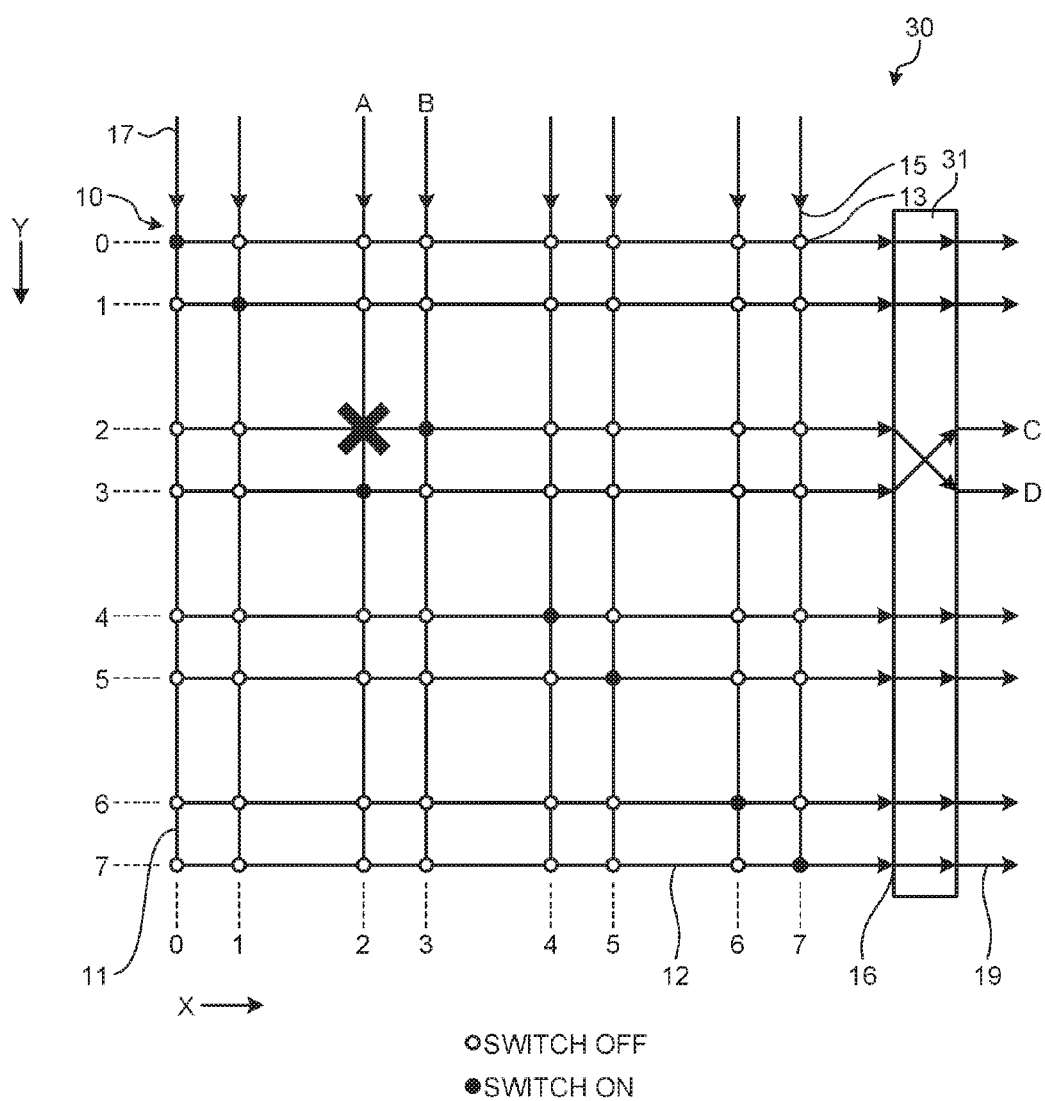
FIG. 19 is a view showing a state of the wiring line switching circuit and switches in a case where a fault has occurred in a switch.

FIG. 19 is a view showing a state of the wiring line switching circuit 31 and switches 13 in a case where a fault has occurred in a switch 13. FIG. 19 shows the routing module 30 in a state where a fault has occurred in one of the switches 13 shown in FIG. 18.

In the example shown in FIG. 19, it is assumed that an open fault has occurred in the switch 13 at (2,2). The routing module 30 switches a route that uses the switch 13 at (2,2) to transmit a signal from a wiring line 11 to a wiring line 12, to another route.

By rewriting configuration bits, the switches 13 at (2,3) and (3,2) are switched from OFF to ON. The switch 13 at (3,3) is switched from ON to OFF.

The wiring line switching circuit 31 sends a signal from the output end 16 at Y=2 to the output signal line 19 at Y=3. Further, the wiring line switching circuit 31 sends a signal from the output end 16 at Y=3 to the output signal line 19 at Y=2.

A signal from a first element "A" is input through the switch 13 at (2,3) into the wiring line 12 at Y=3. The wiring line switching circuit 31 sends the signal from the output end 16 at Y=3 to the output signal line 19 at Y=2. The signal passes through the output signal line 19 at Y=2, and proceeds to a second element "C".

A signal from a first element "B" is input through the switch 13 at (3,2) into the wiring line 12 at Y=2. The wiring line switching circuit 31 sends the signal from the output end 16 at Y=2 to the output signal line 19 at Y=3. The signal passes through the output signal line 19 at Y=3, and proceeds to a second element "D".

As described above, in the example shown in FIG. 19, the wiring line switching circuit 31 exchanges wiring lines 12 for transmitting signals output from the output signal lines 19 at Y=2 and 3. Along with this exchange of wiring lines 12, the routing module 30 switches the ON and OFF of switches 13. Consequently, the routing module 30 switches signal transmission routes.

In the example shown in FIG. 19, when a fault generated in the switch 13 at (2,2) is a closed fault, the routing module 30 does not need to switch signal transmission routes. In this case, the routing module 30 can control the wiring line switching circuit 31 and the switches 13, as in a case where no fault is present in the switches 13, to transmit signals from first elements to second elements.

According to the second embodiment, the routing module 30 can rebuild transmission routes for fault avoidance within the routing module 30, and thereby it can provide high reliability. The routing module 30 switches transmission routes by use of existing wiring lines 11 and 12 and switches 13, and thereby it can reduce the circuit scale. The change of transmission routes is restricted within the routing module 30 where a fault has occurred, and thereby the routing module 30 can suppress deterioration of the performance. Consequently, the FPGA 1 and the routing module 30 provide an effect capable of reducing the circuit scale and attaining high reliability and high performance.

Third Embodiment

Figure 20:
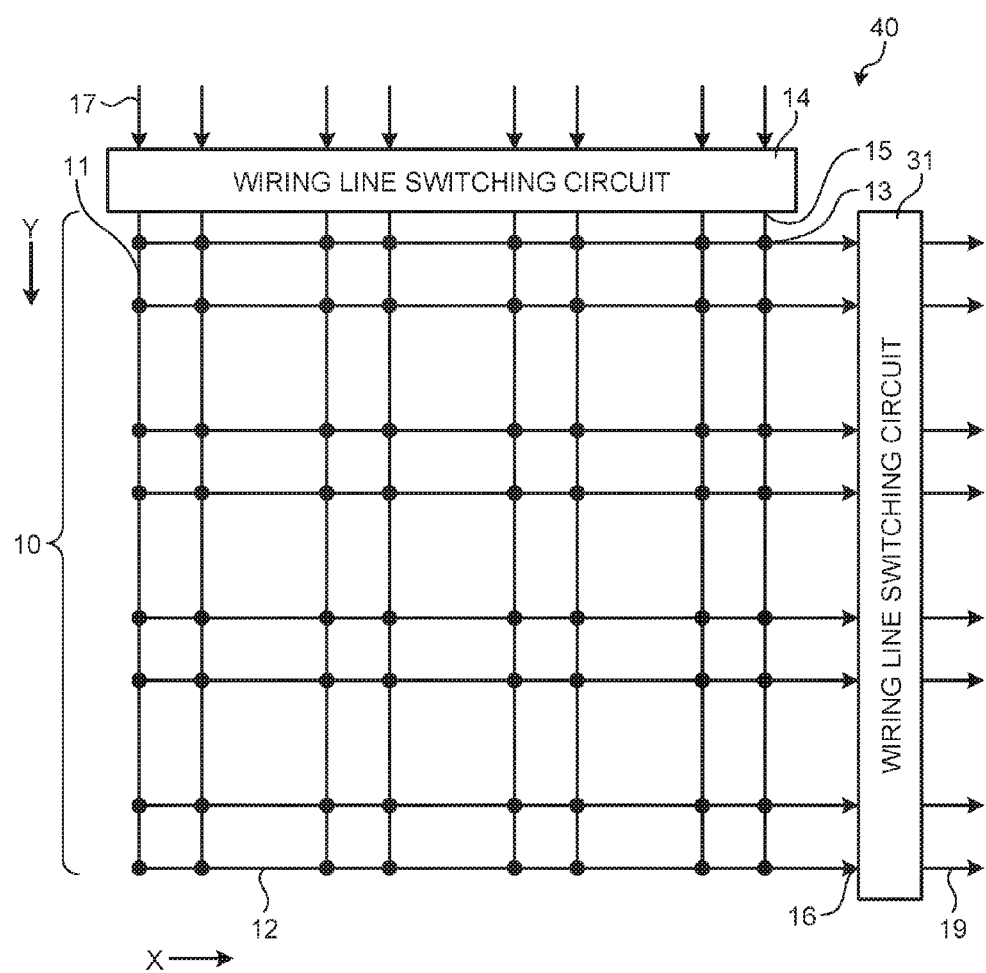
FIG. 20 is a view showing a routing module included in an FPGA according to a third embodiment.

FIG. 20 is a view showing a routing module included in an FPGA, which is a semiconductor apparatus according to a third embodiment. The constituent elements corresponding to those of the first and second embodiments are denoted by the same reference symbols, and their repetitive description will be omitted. The FPGA 1 according to the third embodiment includes a routing module 40 in place of the routing module 4 according to the first embodiment.

The routing module 40 includes a crossbar area 10 and two wiring line switching circuits 14 and 31. Further, the routing module 40 includes CMs 8 and 9 as in the routing module 4 shown in FIG. 1.

The wiring line switching circuit 14, which is a first circuit, is interposed between input signal lines 17 from first elements and the input ends 15 of wiring lines 11. The wiring line switching circuit 14 switches input ends 15 to connect with first elements.

The wiring line switching circuit 31, which is a second circuit, is interposed between the output ends 16 of wiring lines 12 and output signal lines 19 to second elements. The wiring line switching circuit 31 switches output ends 16 to connect with second elements.

The routing module 40 switches signal transmission routes by switching connections in the wiring line switching circuits 14 and 31 and by switching the ON and OFF of switches 13. The routing module 40 switches wiring lines 11 and 12 by use of the two wiring line switching circuits 14 and 31, and thereby it can set transmission routes in various states.

According to the third embodiment, the routing module 40 can flexibly switch transmission routes, even if a plurality of faults have occurred in the crossbar area 10. Consequently, the FPGA 1 and the routing module 40 provide an effect capable of reducing the circuit scale and attaining high reliability and high performance.

Fourth Embodiment

Figure 21:
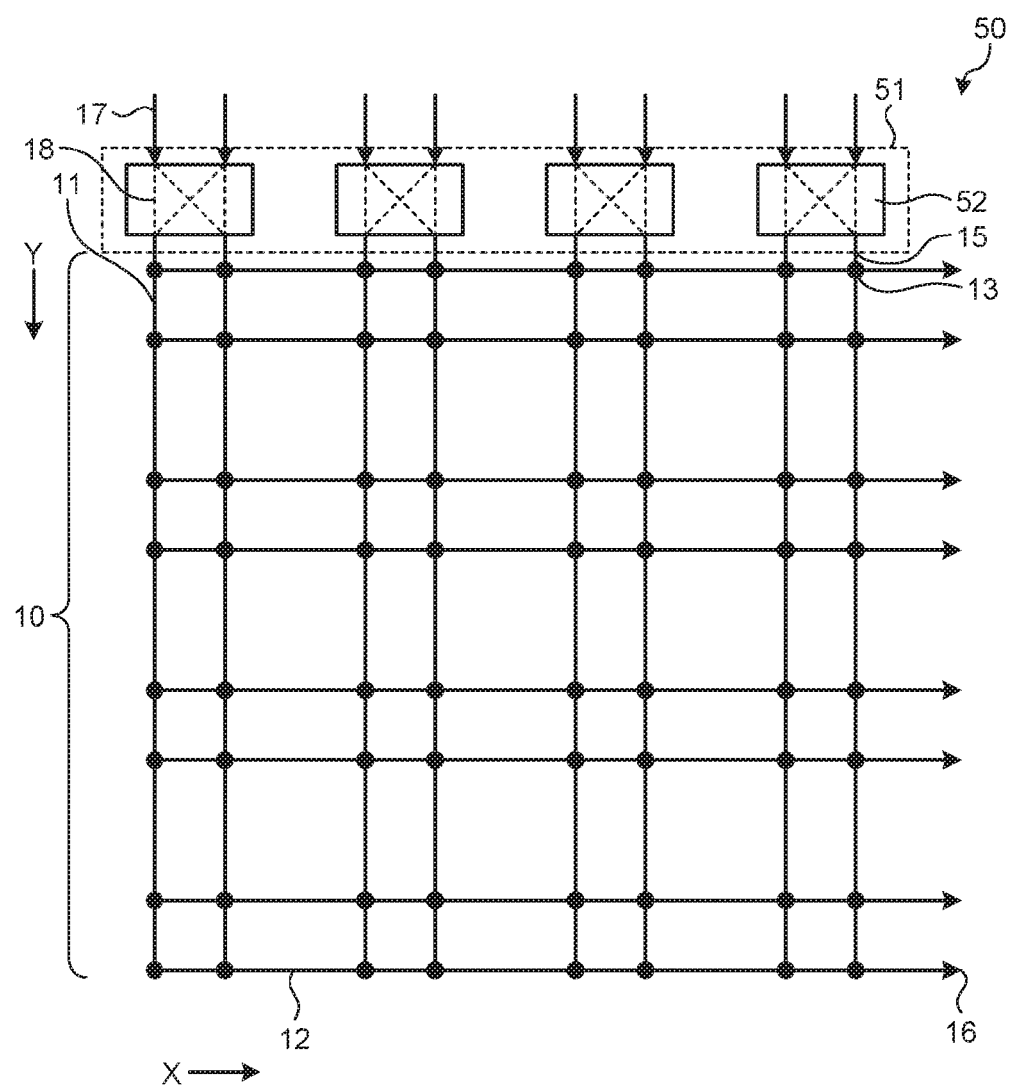
FIG. 21 is a view showing a routing module included in an FPGA according to a fourth embodiment.

FIG. 21 is a view showing a routing module included in an FPGA, which is a semiconductor apparatus according to a fourth embodiment. The constituent elements corresponding to those of the first embodiment are denoted by the same reference symbols, and their repetitive description will be omitted. The FPGA 1 according to the fourth embodiment includes a routing module 50 in place of the routing module 4 according to the first embodiment.

The routing module 50 includes a crossbar area 10 and a wiring line switching circuit 51. The wiring line switching circuit 51 is interposed between input signal lines 17 from first elements and the input ends 15 of wiring lines 11. Further, the routing module 50 includes CMs 8 and 9 as in the routing module 4 shown in FIG. 1.

The wiring line switching circuit 51 includes a plurality of subsets 52. Each of the subsets 52 is disposed between two input signal lines 17 and two input ends 15. The subset 52 is a circuit that can switch wiring lines 11 for transmitting signals, in association with every two inputs. The wiring line switching circuit 51 switches wiring lines 11 used for connection inside the subsets 52.

The subset 52 includes links 18 branched from each of the input signal lines 17 to the two input ends 15, and can switch the transmittal and blockade of a signal at each of the links 18. Here, no link 18 is disposed between the subsets 52. The subset 52 may be designed such that each of the input ends 15 is provided with a selection circuit for selecting one of signals from the two input signal lines 17. The subset 52 may have any constitution that can switch wiring lines 11 for transmitting signals.

The routing module 50 switches signal transmission routes by exchange between the wiring lines 11 connected to the same subset 52. The change of transmission routes for the fault avoidance is restricted within the wiring lines 11 connected to the same subset 52. The routing module 50 can reduce the change of transmission routes in terms of their positions and lengths, as compared with a case where the change of transmission routes is performed within the entire crossbar area 10. Thus, the FPGA 1 and the routing module 50 can further suppress deterioration of the transmission performance caused by fault avoidance.

The wiring line switching circuit 51 does not include any links 18 between the individual subsets 52, and thereby it can reduce the number of links 18 inside the wiring line switching circuit 51. Consequently, the wiring line switching circuit 51 can be formed of a simple and small scale circuit constitution.

The subset 52 is not limited to a circuit that can switch wiring lines 11 in association with every two inputs. The subset 52 may be a circuit that can switch wiring lines 11 in association with every three or more inputs. The wiring line switching circuit 51 is only required to include two or more subsets 52. The subset 52 may include any one of a fully connected network, a multi stage network, and a selection circuit.

The wiring line switching circuit 51 may be interposed between the output ends 16 and the output signal lines 19, as in the second embodiment of the wiring line switching circuit 31. In this case, each of the subsets 52 is disposed between a plurality of output ends 16 and a plurality of output signal lines 19. The subset 52 switches wiring lines 12 for transmitting signals. Further, the routing module 50 may include two wiring line switching circuits 51 respectively disposed at the input ends 15 and the output ends 16 in the crossbar area 10.

According to the fourth embodiment, the routing module 50 switches wiring lines 11 or 12 in each of the subsets 52. The change of transmission routes is restricted within the wiring lines 11 or 12 connected to the same subset 52, and thereby the routing module 50 can suppress deterioration of the performance. In the fourth embodiment also, the FPGA 1 and the routing module 50 provide an effect capable of reducing the circuit scale and attaining high reliability and high performance.

Fifth Embodiment

Figure 22:
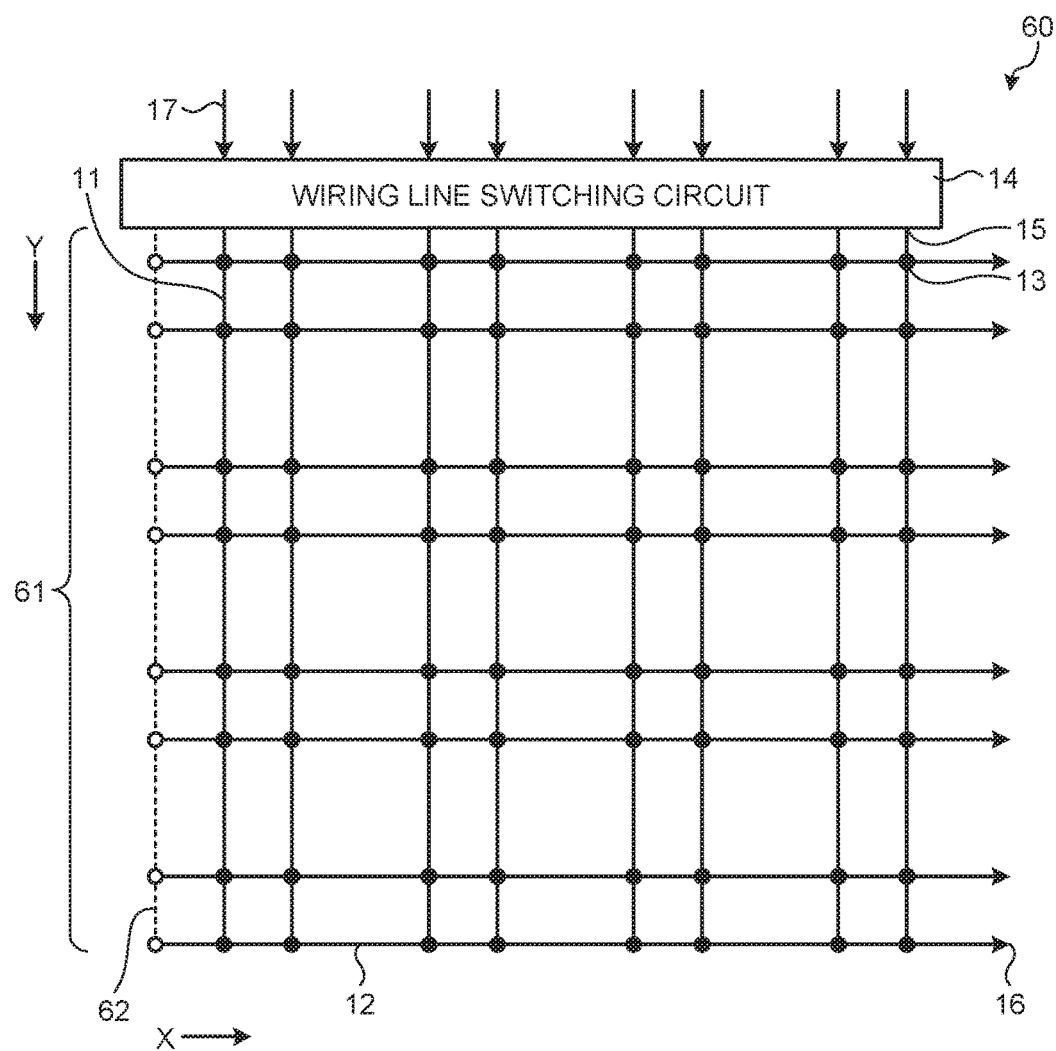
FIG. 22 is a view showing a routing module included in an FPGA according to a fifth embodiment.

FIG. 22 is a view showing a routing module included in an FPGA, which is a semiconductor apparatus according to a fifth embodiment. The constituent elements corresponding to those of the first and second embodiments are denoted by the same reference symbols, and their repetitive description will be omitted. The FPGA 1 according to the fifth embodiment includes a routing module 60 in place of the routing module 4 according to the first embodiment.

The routing module 60 includes a crossbar area 61 and a wiring line switching circuit 14. Further, the routing module 60 includes CMs 8 and 9 as in the routing module 4 shown in FIG. 1.

The crossbar area 61 includes a plurality of wiring lines 11 and 12, a plurality of switches 13, and a wiring line 62. The wiring line 62 serves as a first spare wiring line. The wiring line 62 has an input end 15, and is disposed adjacent to and in parallel with the wiring line 11 at X=0, for example. However, the position of the wiring line 62 may be suitably changed. Further, the routing module 60 is not limited to a design including only one wiring line 62. The routing module 60 may include a plurality of wiring lines 62.

The wiring line switching circuit 14 can connect each of the input signal lines 17 to the input end 15 of the wiring line 62. Switches 13 are respectively disposed at the intersection points between the wiring line 62 and the wiring lines 12. In FIG. 22, black colored switches 13 indicate switches disposed at the intersection points between the wiring lines 11 and the wiring lines 12, and white colored switches 13 indicate switches disposed at the intersection points between the wiring line 62 and the wiring lines 12.

When no fault is present in the switches 13, the wiring line switching circuit 14 sends signals from the respective input signal lines 17 straight to input ends 15 having the same X coordinate values as the respective input signal lines 17. The routing module 60 does not use the wiring line 62 to transmit a signal. When a fault has occurred in a switch 13, the routing module 60 builds transmission routes capable of avoiding the fault by use of wiring lines 11 and the wiring line 62.

The FPGA 1 can use the spare wiring line 62 in addition to the existing wiring lines 11, in rebuilding transmission routes. The routing module 60 can use the spare wiring line 62, and thereby it can improve the flexibility in the change of transmission routes. Consequently, the FPGA 1 and the routing module 60 can avoid a larger number of faults in the crossbar area 61, and thereby it can attain higher reliability.

Figure 23:
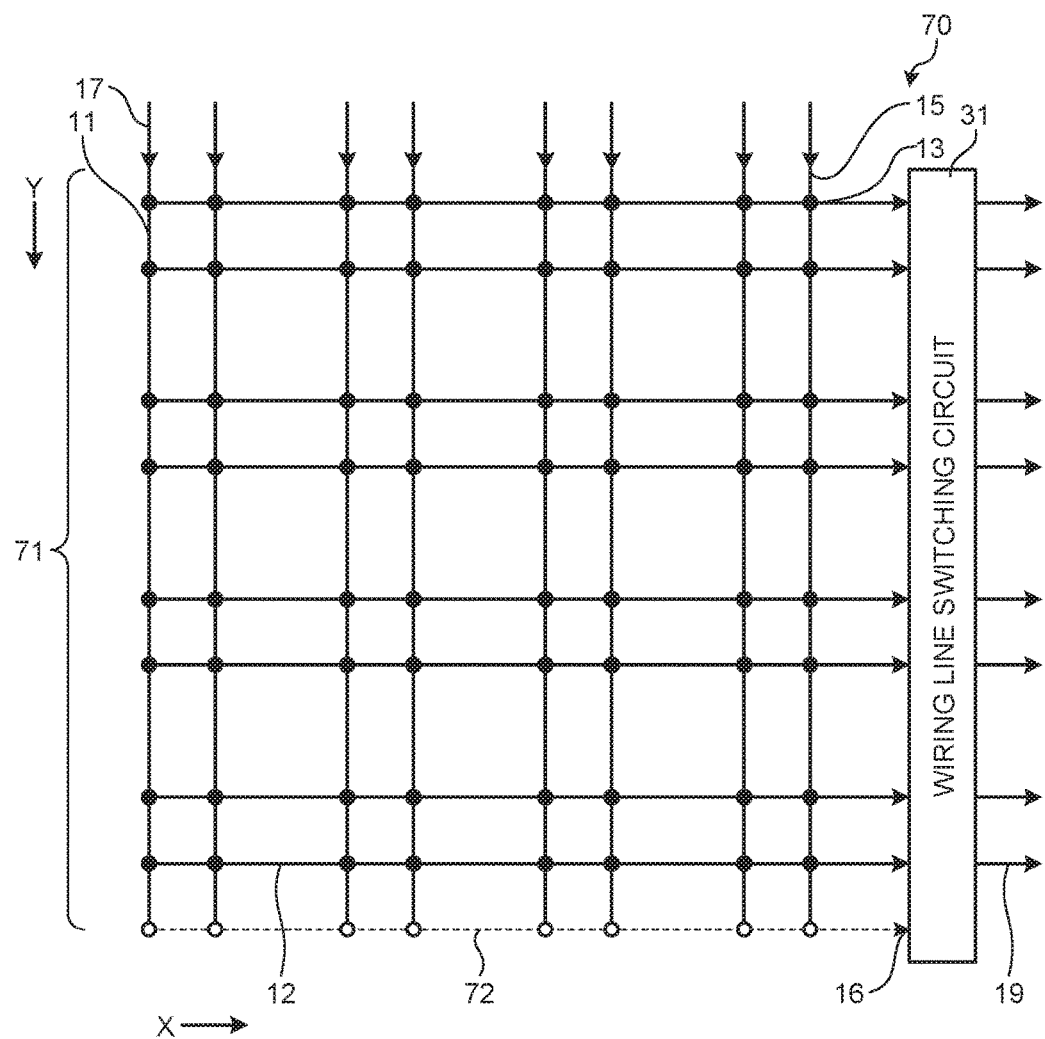
FIG. 23 is a view showing a routing module according to a first modification of the fifth embodiment.

FIG. 23 is a view showing a routing module according to a first modification of the fifth embodiment. The routing module 70 according to the first modification includes a crossbar area 71 and a wiring line switching circuit 31.

The crossbar area 71 includes a plurality of wiring lines 11 and 12, a plurality of switches 13, and a wiring line 72. The wiring line 72 serves as a second spare wiring line. The wiring line 72 has an output end 16, and is disposed adjacent to and in parallel with the wiring line 12 at Y=7, for example. However, the position of the wiring line 72 may be suitably changed. Further, the routing module 70 is not limited to a design including only one wiring line 72. The routing module 70 may include a plurality of wiring lines 72.

The wiring line switching circuit 31 can connect the output end 16 of the wiring line 72 to each of the output signal lines 19. Switches 13 are respectively disposed at the intersection points between the wiring line 72 and the wiring lines 11. In FIG. 23, black colored switches 13 indicate switches disposed at the intersection points between the wiring lines 11 and the wiring lines 12, and white colored switches 13 indicate switches disposed at the intersection points between the wiring lines 11 and the wiring line 72.

When no fault is present in the switches 13, the wiring line switching circuit 31 sends signals from the respective output ends 16 straight to output signal lines 19 having the same Y coordinate values as the respective output ends 16. The routing module 70 does not use the wiring line 72 to transmit a signal. When a fault has occurred in a switch 13, the routing module 70 builds transmission routes capable of avoiding the fault by use of wiring lines 12 and the wiring line 72.

The FPGA 1 can use the spare wiring line 72 in addition to the existing wiring lines 12, in rebuilding transmission routes. The routing module 70 can use the spare wiring line 72, and thereby it can improve the flexibility in the change of transmission routes. In the first modification also, the FPGA 1 and the routing module 70 can avoid a larger number of faults in the crossbar area 71, and thereby it can attain higher reliability.

Figure 24:
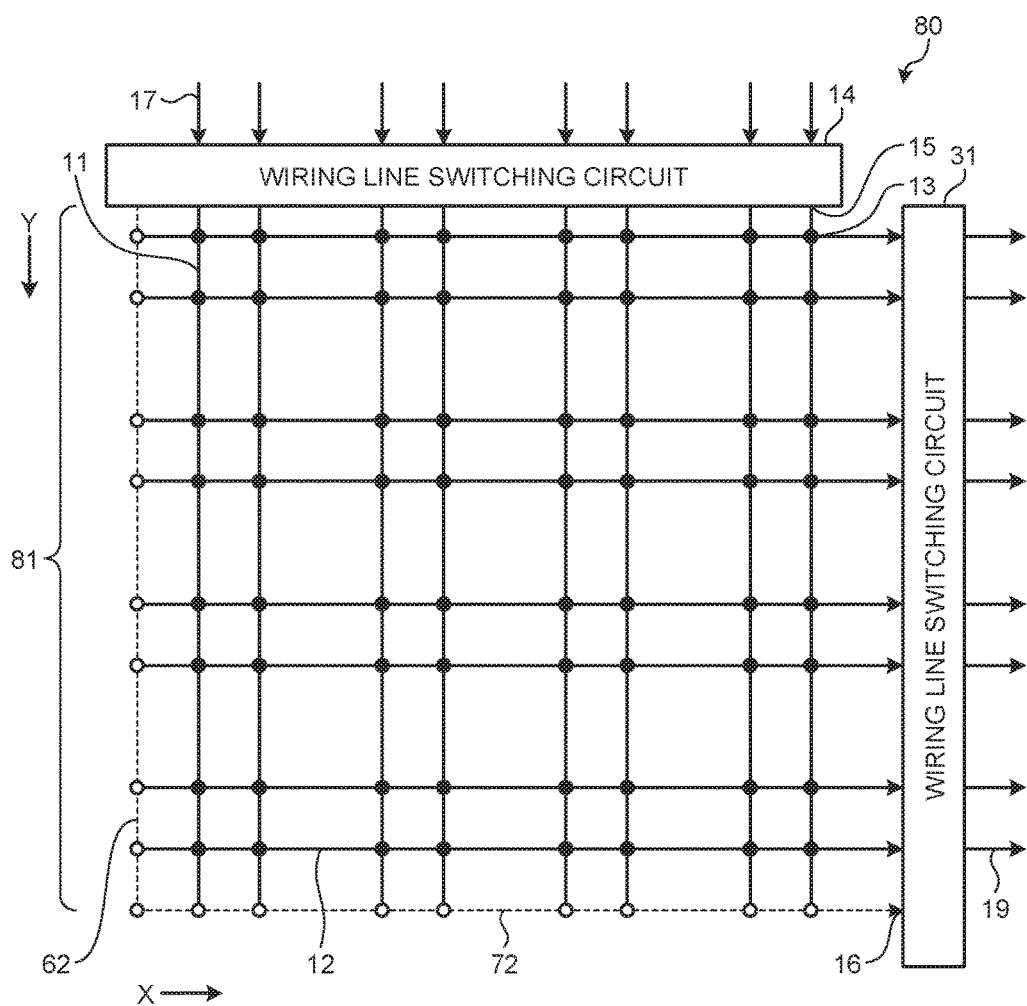
FIG. 24 is a view showing a routing module according to a second modification of the fifth embodiment.

FIG. 24 is a view showing a routing module according to a second modification of the fifth embodiment. The routing module 80 according to the second modification includes a crossbar area 81 and two wiring line switching circuits 14 and 31. The crossbar area 81 includes a plurality of wiring lines 11 and 12, a plurality of switches 13, and wiring lines 62 and 72.

The FPGA 1 can use the spare wiring lines 62 and 72 in addition to the existing wiring lines 11 and 12, in rebuilding transmission routes. The routing module 80 can use the spare wiring lines 62 and 72, and thereby it can further improve the flexibility in the change of transmission routes. In the second modification also, the FPGA 1 and the routing module 80 can avoid a larger number of faults in the crossbar area 81, and thereby it can attain higher reliability.

Figure 25:
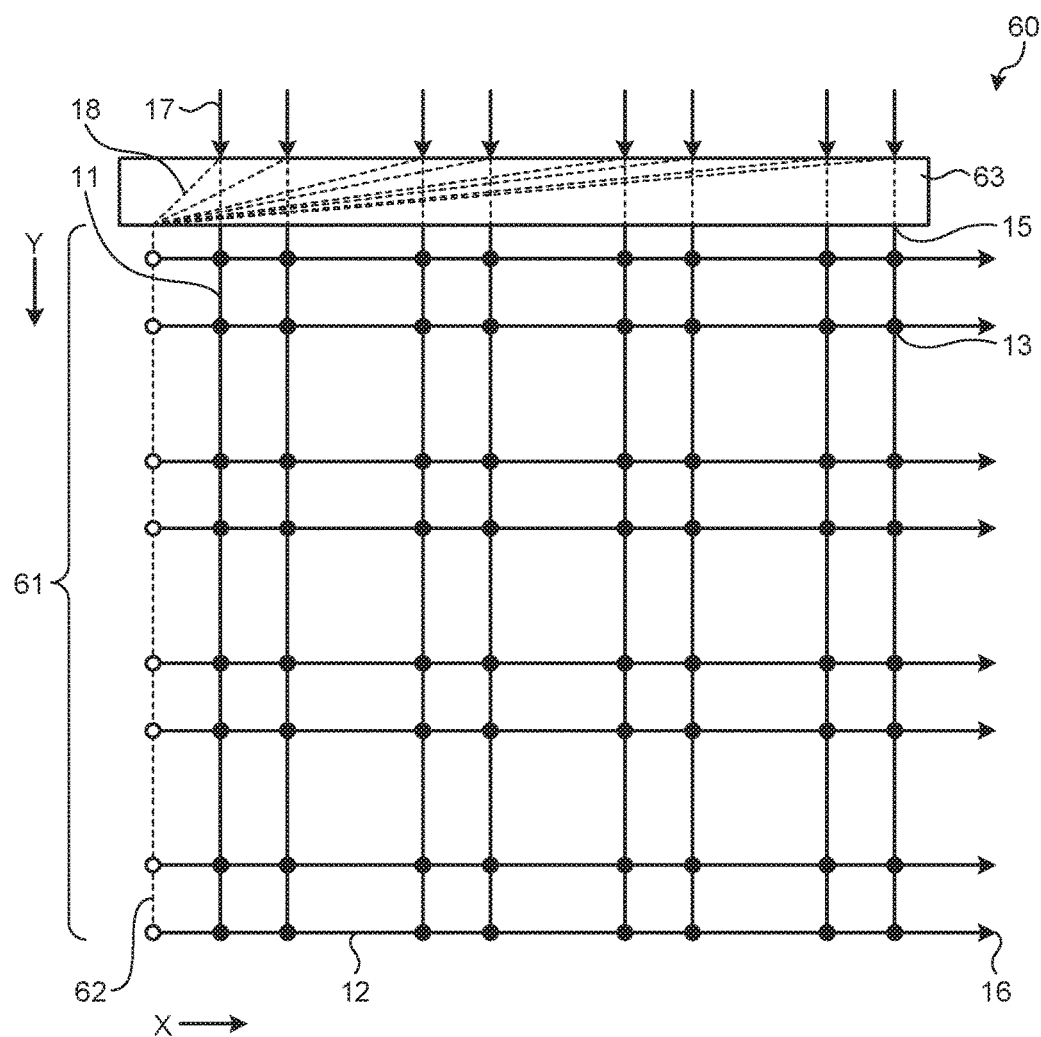
FIG. 25 is a view showing a wiring line switching circuit included in a routing module, according to a modification.

FIG. 25 is a view showing a wiring line switching circuit included in the routing module 60, according to a modification. The routing module 60 includes a wiring line switching circuit 63 in place of the wiring line switching circuit 14 shown in FIG. 22.

The wiring line switching circuit 63 includes links 18 that connect each of the input signal lines 17 to two input ends 15. The wiring line switching circuit 63 allocates two links 18 to one first element to switch the connection and disconnection of the first element with respect to two input ends 15.

One of the links 18 sends a signal from one input signal line 17 straight to an input end 15 having the same X coordinate value as this input signal line 17. The other of the links 18 sends a signal from this input signal line 17 to the input end 15 of a wiring line 62.

When no fault is present in the switches 13, the wiring line switching circuit 63 sends signals from the respective input signal lines 17 straight to the input ends 15 of the respective wiring lines 11. When a fault has occurred in a switch 13, the wiring line switching circuit 63 disconnects the link 18 between an input signal line 17 and the input end 15 of a wiring line 11, which is supposed to transmit a signal to a transmission route including the faulty switch 13. Further, the wiring line switching circuit 63 connects the link 18 between this input signal line 17 and the input end 15 of the wiring line 62.

The routing module 60 switches the transmission route including the faulty portion, while it eliminates the necessity of changing the other transmission routes. The routing module 60 can reduce the change of initially set transmission routes, and thereby it can suppress deterioration of the signal transmission performance. The wiring line switching circuit 63 allocates two links 18 to each of the first elements, and thereby it can be formed of a simple and small scale circuit constitution.

The routing module 70 shown in FIG. 23 may include the wiring line switching circuit 63 according to this modification, in place of the wiring line switching circuit 31. The routing module 80 shown in FIG. 24 may include the wiring line switching circuit 63 according to this modification, in place of at least one of the two wiring line switching circuits 14 and 31.

According to the fifth embodiment, the routing modules 60, 70, and 80 can use the spare wiring lines 62 and/or 72 to switch transmission routes. Consequently, the FPGA 1 and the routing modules 60, 70, and 80 can avoid a larger number of faults in the crossbar area, and thereby it can attain higher reliability. In the fifth embodiment also, the FPGA 1 and the routing modules 60, 70, and 80 provide an effect capable of reducing the circuit scale and attaining high reliability and high performance.

Sixth Embodiment

Figure 26:
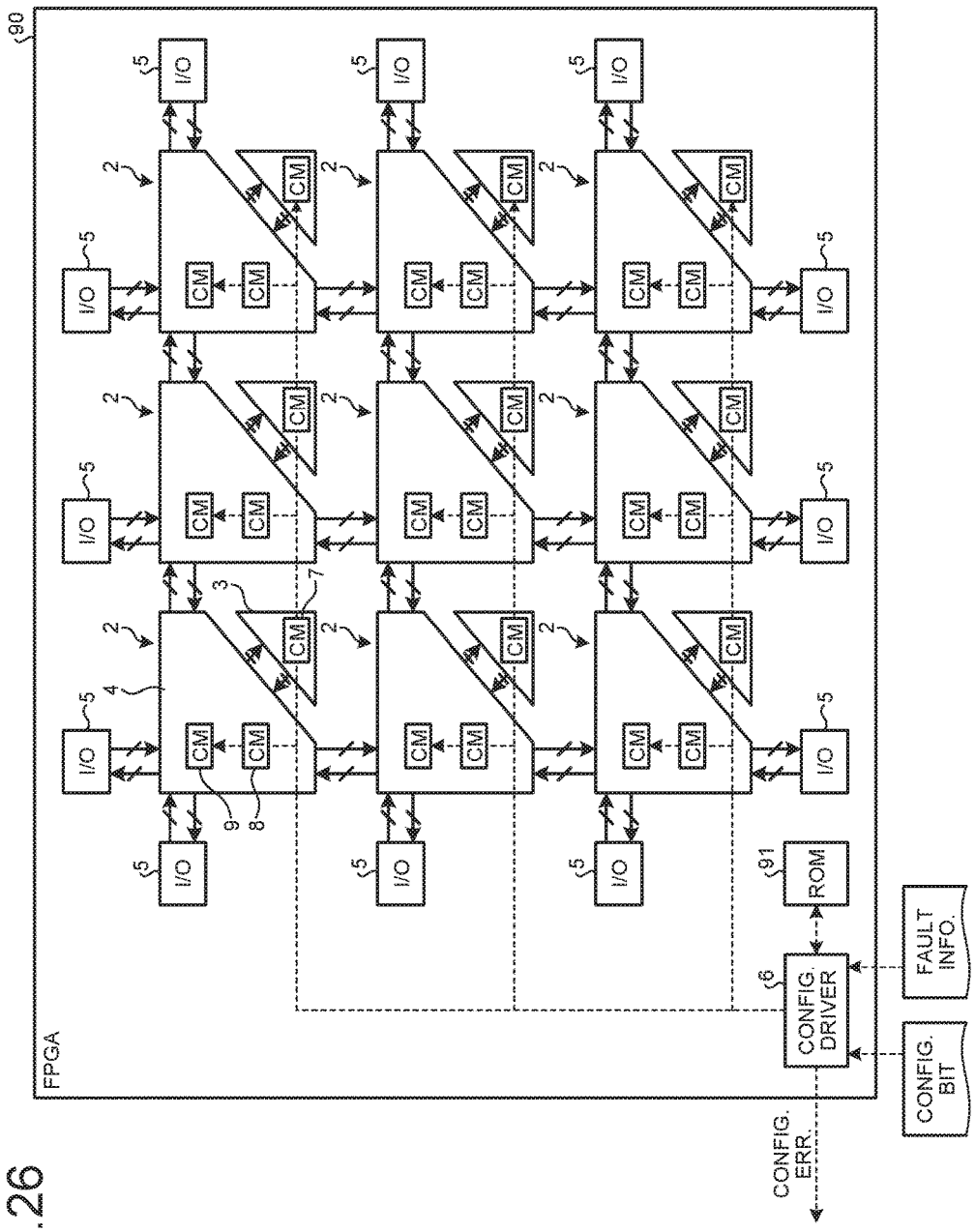
FIG. 26 is a block diagram showing an FPGA according to a sixth embodiment.

FIG. 26 is a block diagram showing an FPGA, which is a semiconductor apparatus according to a sixth embodiment. The constituent elements corresponding to those of the first embodiment are denoted by the same reference symbols, and their repetitive description will be omitted. The FPGA 90 according to the sixth embodiment includes a ROM (read only memory) 91. The ROM 91 holds fault information (fault info.).

For example, during an inspection step in the process of manufacturing the FPGA 90, a test for obtaining the fault information is performed. Unit data rows obtained as an analysis result concerning the fault information are input into the FPGA 90. A configuration driver 6 writes the input fault information into the ROM 91.

The bit converter 22 rewrites input configuration bits, in accordance with the fault information written in the ROM 91. Consequently, the FPGA 90 can compensate for faults found during the manufacturing process.

Every time the FPGA 90 is activated, the configuration driver 6 reads in the fault information from the ROM 91. Consequently, a user of the FPGA 90 does not need to input the fault information into the FPGA 90. The manufacturer does not need to provide the fault information by use of a storage medium or communication means.

In place of unit data rows obtained as an analysis result concerning the fault information, the ROM 91 may hold fault information formed of data rows before the analysis. In this case, the fault analyzer 21 analyzes the contents of fault information read out from the ROM 91. The bit converter 22 rewrites the configuration bits, in accordance with the analysis result.

The fault information written in the ROM 91 may be set such that it can be renewed. When new fault information is input into the FPGA 90, the configuration driver 6 renews the contents of fault information held in the ROM 91. If the configuration driver 6 recognizes a new data row including a fault flag "1", it adds this data row into the ROM 91. If a new data row including a fault flag "1" is not recognized, the fault information in the ROM 91 is not renewed.

The FPGA 90 can renew the fault information in the ROM 91, and thereby it can compensate for a fault newly generated because of aged deterioration, in addition to the initial defects.

Fault information to be input into the FPGA 90 on purpose of renewal may be formed of unit data rows obtained as an analysis result, or may be formed of data rows before analysis. In a case where fault information to be input into the FPGA 90 is formed of the unit data rows, the FPGA 90 may be designed to omit the fault analyzer 21.

Figure 27:
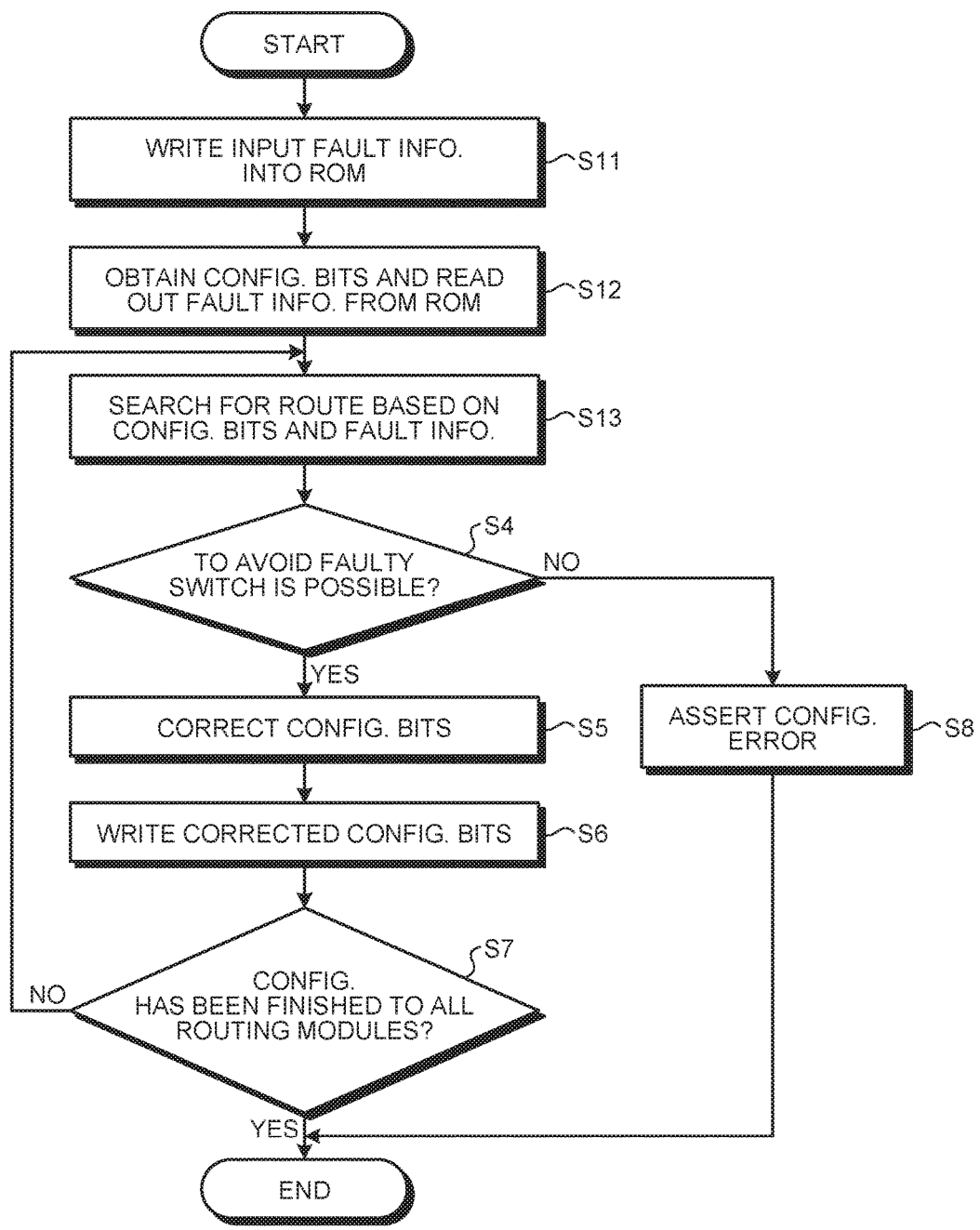
FIG. 27 is a flow chart for explaining an operation for fault avoidance performed by the FPGA according to the sixth embodiment.

FIG. 27 is a flow chart for explaining an operation for fault avoidance performed by the FPGA 90. The configuration driver 6 writes unit bit rows, which are fault information input in the FPGA 90, into the ROM 91 (S11). This writing in S11 is performed as an initial setting in the process of manufacturing the FPGA 90.

When the FPGA 90 is activated, the configuration driver 6 obtains configuration bits. The configuration driver 6 reads out fault information from the ROM 91 (S12).

The bit converter 22 searches for a route for avoiding a faulty switch 13, based on the configuration bits and the fault information (S13). Thereafter, the FPGA 90 performs the processes from S4 to S9 as in the first embodiment. Then, the FPGA 90 ends the operation for fault avoidance.

According to the sixth embodiment, the FPGA 90 rewrites configuration bits by use of fault information stored in the ROM 91. In the sixth embodiment also, the FPGA 90 and the routing module 4 provide an effect capable of reducing the circuit scale and attaining high reliability and high performance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor apparatus comprising a block including a logic circuit and a routing module, and a controller, the routing module being arranged to build a transmission route for outputting signals input from first elements to second elements, the first elements including the logic circuit and elements connected to the block, the second elements including the logic circuit and elements connected to the block,
the routing module including:
a plurality of first wiring lines respectively having input ends, into one of which a signal from one of the first elements is to be input;
a plurality of second wiring lines respectively having output ends, from one of which a signal is to be output to one of the second elements;
switches, one of the switches arranged to perform connection and disconnection between one of the first wiring lines and one of the second wiring lines; and
a wiring line switching circuit arranged to switch connections between the input ends and the first elements or switch connections between the output ends and the second elements,
wherein the controller is arranged to control driving of the switches and the wiring line switching circuit.

2. The semiconductor apparatus according to claim 1, wherein the wiring line switching circuit is arranged to switch one of the input ends to connect with one of the first elements, and
the wiring line switching circuit is interposed between all input signal lines from the first elements and the input ends.

3. The semiconductor apparatus according to claim 1, wherein the wiring line switching circuit is arranged to switch one of the output ends to connect with one of the second elements, and
the wiring line switching circuit is interposed between the output ends and all output signal lines to the second elements.

4. The semiconductor apparatus according to claim 1, wherein the wiring line switching circuit includes a first circuit arranged to switch one of the input ends to connect with one of the first elements, and a second circuit arranged to switch one of the output ends to connect with one of the second elements,
the first circuit is interposed between all input signal lines from the first elements and the input ends, and
the second circuit is interposed between the output ends and all output signal lines to the second elements.

5. The semiconductor apparatus according to claim 1, wherein the controller is arranged to control driving of the switches and the wiring line switching circuit, based on fault information about the switches.

6. The semiconductor apparatus according to claim 1, comprising a memory that holds fault information about the switches,
wherein the controller is arranged to control driving of the switches and the wiring line switching circuit, based on the fault information held in the memory.

7. The semiconductor apparatus according to claim 1, wherein the wiring line switching circuit includes links capable of connecting one of the first elements to one of all the input ends.

8. The semiconductor apparatus according to claim 1, wherein the wiring line switching circuit includes links capable of connecting one of the first elements to one of two input ends disposed adjacent to one another.

9. The semiconductor apparatus according to claim 1, wherein the wiring line switching circuit includes links capable of connecting one of the first elements to one of three input ends disposed adjacent to one another.

10. The semiconductor apparatus according to claim 1, wherein the wiring line switching circuit includes a plurality of subsets, and is arranged to switch a wiring line for transmitting the signal in one of the subsets.

11. The semiconductor apparatus according to claim 1, wherein the routing module further includes a first spare wiring line having an input end, and
wherein the wiring line switching circuit is arranged to switch connection and disconnection between the first elements and the input end of the first spare wiring line.

12. The semiconductor apparatus according to claim 11, wherein the wiring line switching circuit includes links capable of connecting one of the first elements to one of the input ends of the plurality of first wiring lines, and a link capable of connecting this one first element to the input end of the first spare wiring line.

13. The semiconductor apparatus according to claim 1, wherein the routing module further includes a second spare wiring line having an output end, and
wherein the wiring line switching circuit is arranged to switch connection and disconnection between the second elements and the output end of the second spare wiring line.

14. The semiconductor apparatus according to claim 1, wherein a plurality of blocks are arrayed in a two-dimensional state, in which routing modules of adjacent ones of the plurality of blocks are connected to one another.

15. A routing module included in a logic block that constitutes a semiconductor apparatus, the routing module being arranged to build a transmission route for outputting signals input from first elements to second elements, the first elements including a logic circuit included in the logic block and elements connected to the logic block, the second elements including a logic circuit included in the logic block and elements connected to the logic block,
the routing module comprising:
a plurality of first wiring lines respectively having input ends, into one of which a signal from one of the first elements is to be input;
a plurality of second wiring lines respectively having output ends, from one of which a signal is to be output to one of the second elements;
switches, one of the switches arranged to perform connection and disconnection between one of the first wiring lines and one of the second wiring lines; and
a wiring line switching circuit arranged to switch connections between the input ends and the first elements or switch connections between the output ends and the second elements.

16. The routing module according to claim 15, wherein the wiring line switching circuit is arranged to switch one of the input ends to connect with one of the first elements, and
the wiring line switching circuit is interposed between all input signal lines from the first elements and the input ends.

17. The routing module according to claim 15, wherein the wiring line switching circuit is arranged to switch one of the output ends to connect with one of the second elements, and the wiring line switching circuit is interposed between the output ends and all output signal lines to the second elements.

18. The routing module according to claim 15, wherein the wiring line switching circuit includes a plurality of subsets, and is arranged to switch connections between the input ends and the first elements in one of the subsets or switch connections between the output ends and the second elements in one of the subsets.

19. A control method of a semiconductor apparatus including a block, the block including a logic circuit and a routing module, the routing module being arranged to build a transmission route for outputting signals input from first elements to second elements, the first elements including the logic circuit and elements connected to the block, the second elements including the logic circuit and elements connected to the block, the control method comprising:
 obtaining first information for controlling driving of switches and a wiring line switching circuit, one of the switches being arranged to perform connection and disconnection between one of first wiring lines and one of second wiring lines, the wiring line switching circuit being arranged to switch connections between the input ends and the first elements or switch connections between the output ends and the second elements, a signal being to be input from one of the first elements into one of the first wiring lines, a signal being to be output from one of the second wiring lines to one of the second elements;
 correcting the first information, based on second information about occurrence of a fault in the switches; and
 controlling driving of the switches and the wiring line switching circuit, based on the first information in a corrected state.

20. The control method of a semiconductor apparatus according to claim 19, comprising reading out the second information from a memory included in the semiconductor apparatus.

* * * * *